United States Patent [19]
Takahashi et al.

[11] Patent Number: 5,900,671
[45] Date of Patent: May 4, 1999

[54] ELECTRONIC COMPONENT INCLUDING CONDUCTOR CONNECTED TO ELECTRODE AND ANODICALLY BONDED TO INSULATING COATING

[75] Inventors: Yoshiharu Takahashi; Toshiaki Shinohara, both of Kikuchi-gun, Japan

[73] Assignee: Mitsubishi Denki Kabushiki Kaisha, Tokyo, Japan

[21] Appl. No.: 08/499,906

[22] Filed: Jul. 11, 1995

[30] Foreign Application Priority Data

Jul. 12, 1994 [JP] Japan .................................. 6-160350

[51] Int. Cl.⁶ .......................... H01L 23/50; H01L 23/48; H01L 29/84
[52] U.S. Cl. .......................... 257/735; 257/666; 257/676; 257/642; 257/673; 257/287
[58] Field of Search .................................. 257/735, 737, 257/738, 787, 666, 692, 668, 676, 697, 673

[56] References Cited

U.S. PATENT DOCUMENTS

| | | |
|---|---|---|
| 4,010,488 | 3/1977 | Gruszka et al. . |
| 4,291,293 | 9/1981 | Yameda et al. .......................... 257/417 |
| 4,495,820 | 1/1985 | Shimada et al. .......................... 257/419 |
| 4,607,276 | 8/1986 | Butt .......................................... 361/406 |
| 4,712,082 | 12/1987 | Ito et al. ...................................... 338/4 |
| 4,773,972 | 9/1988 | Mikkor ...................................... 437/901 |
| 4,874,499 | 10/1989 | Smith et al. ................................ 257/44 |
| 4,949,158 | 8/1990 | Ueda ........................................ 257/774 |
| 5,065,223 | 11/1991 | Motsuki et al. .......................... 257/678 |
| 5,153,710 | 10/1992 | McCain .................................... 365/228 |
| 5,343,064 | 8/1994 | Spangler et al. .......................... 257/350 |
| 5,371,386 | 12/1994 | Tokunoh et al. .......................... 257/181 |
| 5,431,806 | 7/1995 | Suzuki et al. ............................. 204/415 |
| 5,436,503 | 7/1995 | Kunitomo et al. ........................ 257/737 |
| 5,442,231 | 8/1995 | Miyamoto et al. ....................... 257/668 |
| 5,453,628 | 9/1995 | Hurtsell et al. .......................... 257/419 |
| 5,463,255 | 10/1995 | Isono ........................................ 257/773 |
| 5,478,973 | 12/1995 | Yoon et al. ............................... 361/760 |
| 5,528,078 | 6/1996 | Shin ........................................ 257/676 |
| 5,530,282 | 6/1996 | Tsuji ........................................ 257/666 |
| 5,556,810 | 9/1996 | Fujitsu ...................................... 437/209 |
| 5,614,742 | 3/1997 | Gebsnon et al. ........................... 257/18 |
| 5,619,065 | 4/1997 | Kim ........................................ 257/673 |
| 5,710,077 | 1/1998 | Brehm et al. ............................. 438/472 |

FOREIGN PATENT DOCUMENTS

| | | |
|---|---|---|
| 1665042 | 10/1970 | Germany . |
| 4010644 | 8/1991 | Germany . |
| 4230039 | 4/1993 | Germany . |
| 4311762 | 10/1994 | Germany . |
| 53-28747 | 3/1978 | Japan . |
| 5328747 | 8/1978 | Japan . |
| 63-117233 | 5/1988 | Japan . |
| 2141442 | 5/1990 | Japan . |
| 350141 | 3/1991 | Japan . |
| 4117809 | 4/1992 | Japan . |
| 4164841 | 6/1992 | Japan . |
| 4299541 | 10/1992 | Japan . |
| 5335474 | 12/1993 | Japan . |
| 94 24701 | 10/1994 | WIPO . |

OTHER PUBLICATIONS

Patent Abstracts of Japan, E–984, vol. 14, No. 451, Sep. 27, 1990.
Patent Abstracts of Japan, E–1142, vol. 15, No. 482, Dec. 6, 1991.
Hatada et al., "LED Array Modules by New Technology Microbump Bonding Method", IEEE Transactions on Components, Hybrids, and Manufacturing Technology, vol. 13, No. 3, Sep. 1990, pp. 521–527.

Primary Examiner—Alexander Oscar Williams
Attorney, Agent, or Firm—Leydig, Voit & Mayer

[57] ABSTRACT

A semiconductor device and manufacturing method thereof capable of collectively bonding inner leads to a plurality of electrodes to make mechanically and electrically strong coupling therebetween. An insulating coat 2a, having a conductive property when being subjected to heating, is adhered onto a surface of a semiconductor chip 1 other than an electrode 2, and the tip portion of an inner lead 4a from a lead frame 4 is made to extend to cover the top surface of the electrode 2, before the inner lead 4a tip portion and the insulating coat 2a are anode-junctioned with each other so that the electrode 2 and the inner lead 4a are brought into contact with each other under pressure so as to be electrically coupled to each other.

6 Claims, 32 Drawing Sheets

ELECTRONIC COMPONENT INCLUDING CONDUCTOR CONNECTED TO ELECTRODE AND ANODICALLY BONDED TO INSULATING COATING

BACKGROUND OF THE INVENTION

1. Field of the Invention

The present invention relates to an electronic component manufactured using the anode junction and method of manufacturing the electronic component, and more particularly to an electrical contact between outgoing wiring and an electrode portion made with an insulating layer surrounding each electrode portion on a semiconductor chip surface and an electric conductor surface of each outgoing wiring being anode-junctioned (bonded) with each other when the outgoing wiring is simultaneously pressure-joined and connected to the electrode portions on the semiconductor chip surface.

2. Description of the Related Art

FIG. 39 is a perspective view showing a state in which electrodes 2 attached onto a surface of a semiconductor chip 1 according to a conventional ultrasonic thermocompression wire bonding method are connected through gold lines 5 to inner leads 4 extending from lead frames, not shown, and FIG. 40 is a diagrammatic illustration of a state in which one end of the gold line is being connected to the electrode 2 on the semiconductor chip 1 by the ultrasonic thermocompression bonding.

In FIG. 40, the semiconductor chip 1 is fixedly secured through a die bonding material 6 onto a die pad 41. The die bonding material 6 and the die pad 41 can withstand the pressing force from a capillary 7 needed to from a ball 51 at the tip portion of the gold line 5 into a ball bonding configuration 52 when being connected to the electrode 2 by the ultrasonic thermocompression bonding, and further support the semiconductor chip 1. In the ultrasonic thermocompression wire bonding method, the tip portion of the gold line 5 passing through the capillary 7 is turned into the ball 51 configuration by means of a high-voltage discharge. Subsequently, the ball 51 is pressed against the electrode 2 on the semiconductor chip 1 and subjected to ultrasonic vibration and heat, whereby it is ultrasonic thermocompression-bonded to the electrode 2 as indicated at 52 in the same illustration. Further, the capillary 7 is moved to the position of the tip portion of the inner lead 4 before being lowered to couple the tip portion of the inner lead 4 to the gold line 5.

FIGS. 41A, 41B and 42 are illustrations of a structure of a lead frame in a state where the electrodes 2 are coupled through the gold lines 5 to the tip portions of the inner leads 4 in accordance with a conventional ultrasonic thermocompression wire bonding method. In FIG. 41A, a frame 3 is formed integrally with 8 die pads 41, not shown, and 36 inner leads 4, not shown. FIG. 41B is an enlarged view showing a portion indicated by X in FIG. 41A. In FIG. 41B, the frame 3 has 36 inner leads 4 at its inside portion, a die pad 41 supported by the frame 3 through suspended leads 42 at its central portion, and external leads 44 at its circumferential portion. FIG. 42 is an illustration of the detailed structure of the 36 inner leads 4, die pad 41 and suspended leads 42. In the same illustration, a rectangle indicated by a broken line is representative of a position that is packed with a molding resin. FIG. 43 is a cross-sectional view showing a semiconductor device completed such that the electrode 2 is connected through the gold line 5 to the inner lead 4 in accordance with the foregoing ultrasonic thermocompression wire bonding method before the frame 3 is packed with a molding resin 8. In the same illustration, reference numeral 53 designates a contact portion between the inner lead 4 and the gold line 5 due to the ultrasonic thermocompression bonding. FIG. 44 is an enlarged view showing a pressure-bonded portion between an electrode, not shown, and the inner lead 4 on the chip 1, and FIG. 45 is an illustration of the deformation of the ball 51 when the ball 51 is ultrasonic thermocompression-bonded onto the electrode 2 on a surface of the semiconductor chip 1. In the same illustration, when the electrode 2 is an aluminium electrode, the gold line 5 and the ball-deformed portion 52 both consist of the same gold line material at the time of the completion of the ultrasonic thermocompression bonding, while an alloy layer of gold and aluminium is formed as a pressure-bonded layer 54 with the aluminium electrode. Reference numeral 2i depicts an electrically insulating passivation film (which will be referred hereinafter to as an electrically insulating film) attached onto the semiconductor chip 1 at a position other than the electrode 2.

FIG. 46 illustrates a state in which the ball-deformed portion 52 of the gold line 5 is pressed against the electrode 2 by means of the capillary 7 with the completed connection. FIG. 47 shows a state in which the other end portion of the gold line 5 is stitch-bonded to the inner lead 4 by the capillary 7 and its deformed portion 53 is pressed against the tip portion of the inner lead 4. In FIG. 47, although the material of the deformed portion 53 stitch-bonded to the inner lead 4 depends upon the lead frame material, when an iron frame is used, a silver plating is made, and hence an alloy layer made of gold and silver is produced in the stitch side. For this reason, the alloy layer 54 made of gold is present as shown in FIG. 45, but has been omitted in FIG. 47.

FIGS. 48A to 48E are illustrations for describing processes taken for when the inner lead 4 is connected through the gold line 5 to an electrode on the semiconductor chip 1 according to the conventional ultrasonic thermocompression wire bonding technique. In FIG. 48A, heat is transferred from a heating block 9 through the die pad 41 to the chip 1 by heat conduction. The tip portion of the gold line 5 leading from the tip portion of the capillary 7 is formed into a ball configuration by a high voltage power supply torch 10 to have a ball configuration. FIG. 48B shows a state in which the capillary 7 is lowered toward the electrode 2 (omitted from the illustration) so that formed ball 51 is pressure-bonded to the electrode under the ultrasonic vibration and pressing force. FIG. 48C illustrates a state in which the capillary 7 through which the gold line 5 passes is moved toward the inner lead 4 in order for the other end of the gold line 5 to be connected to the inner lead 4 after the ultrasonic thermocompression bonding of the ball 51 is completed as shown in FIG. 45. FIG. 48D is illustrative of a state where the other end of the gold line 5 is stitch-bonded to the inner lead 4, and FIG. 48E is illustrative of a state in which the other end of the gold line 5 is pressure-attached to the inner lead 4 by the stitch bonding in the state as shown in FIG. 47 before the gold line 5 is held and lifted by a clamp 11 of the capillary 7 to be cut off at the stitch bonded portion.

FIG. 49 is a top plan view of a semiconductor chip 1 produced such that the electrode 2 and the inner lead 4 are coupled through the gold line 5 to each other by means of the ultrasonic thermocompression bonding, and FIG. 50 illustrates 19 electrodes 2 on the semiconductor chip 1, wherein reference numeral 2i designates an electrically insulating film attached to a portion other than the electrodes 2 on the semiconductor chip 1. The electrode 2 has a dimension of C×E and the electrically insulating film 2*i* has a dimension of B×D larger than the dimension of the electrode 2, and hence the boundary between the electrode 2 and the electrically insulating film 2*i* appears so that the electrode 2 is exposed as shown in FIG. 51. The cross-sectional structure of the semiconductor chip 1 is made such that the electrically insulating film 2*i* overlaps with the circumferential portion of the electrode 2 as shown in FIG. 45. As illustrated in FIG. 51, in order to increase the electrical and mechanical degree of coupling of the gold line 5, the area of the electrode 2 should be greater than the circumferential area of the ball-deformed portion 52 when the ball 51 is ultrasonic thermocompression-bonded.

Depending upon the accuracy of the wire bonding apparatus, the dimension A between the electrodes 2 as shown in FIG. 51 should be determined taking the circumferential dimension of the ball deformed portion 52 and others into consideration. In general, as long as the ultrasonic thermocompression bonding is made, the width of the electrode 2 to be wire-bonded should be larger than the width of the circuit wiring 21 in FIG. 51. Further, in the case of the conventional wire bonding method, the semiconductor device should be designed on the basis of dimensions I, J, K and L as shown in FIG. 52 while taking into account accuracy and performance of the wire bonding.

FIG. 53 a cross-sectional view taken along the axis where the gold line 5 shown in the plan view of the FIG. 52 is wired over between the electrode 2 and the inner lead 4. Whether or not the dimension of the gold line 5 relative to the corner portion of the semiconductor chip 1 is satisfactory can be known by checking the dimension I. The space between the corner portion of the die pad 41 and the gold wire 5 can be confirmed on the basis of the dimension J and the relationship between the die pad 41 and the inner lead 4. In addition, dimension K must be confirmed to know whether or not there is sufficient dimension to the stitch bonding 53.

FIG. 54A is a perspective view showing the inner structure of a completed semiconductor device (integrated circuit) in which the inner lead 4 is connected through the gold line 5 to the electrode 2 placed at the central portion of the chip 1 according to the ultrasonic thermocompression wiring bonding method. FIG. 54B is a cross-sectional view taken along line Y—Y in FIG. 54A. FIG. 55A is a cross-sectional view of a conventional TAB package. In the same illustration, numeral 21 represents an electrode bump, which is formed on a tape carrier electrode lead (which will be referred hereinafter to as an electrode lead) 4*b* in advance through the thermocompression bonding. FIG. 55B is an enlarged view showing the contact portion of the electrode with the electrode bump 21. In the TAB system, the connection between the electrode of the semiconductor chip 1 and the electrode lead 4*a* is made through the electrode bump 21, thus accomplishing the electrical coupling between the electrode and the electrode lead 4*a*.

FIG. 56 is an illustration for describing one example of a method of anode-junctioning a semiconductor material (member) made of silicon with an electrically insulating material (member), as disclosed in Japanese Patent Publication No. 53-28747. In FIG. 56, a semiconductor material 1*a* is placed on a resistance heating strip 67 to be energized and heated by a power supply A. Onto a surface of the semiconductor material 1*a* there is attached a glass film 1*b* being an insulating coat (for example, boro-silicate glass made of boric acid and silicic acid) which shows slightly electrical conductivity property when being heated. Further, numeral 68 designates an electrically insulating material which is layered up and joined on and with the semiconductor material 1*a* with the insulating coat (film) 1*b* being interposed therebetween, and numeral 65 denotes a pressure connecting piece for lightly pressing the electrically insulating material 68 against the semiconductor material 1*a*. Further a positive electrode terminal 63 of a direct-current power supply 60 is connected to the resistance heating strip 67 for causing the positive current to flow from the semiconductor material 1*a* to the electrically insulating material 68, while the negative electrode terminal thereof is connected with the pressure connecting piece 65.

Next, a description will be made in terms of the anode junction method. The semiconductor material 1*a* is heated through the resistance heating strip 67 to the extent that the insulating coat 1*b* has slight electrical conductive characteristics (to approximately 400 to 700 degrees, depending upon the insulating coat material). As a result, a small positive current (for example, several $\mu A/mm^2$) flows for about one minute from the semiconductor material 1*a* to the electrically insulating material 68, whereby an anode growth oxide junction takes place in the boundary between the semiconductor material 1*a* and the electrically insulating material 68, thus completing the anode junction between the semiconductor material 1*a* and the electrically insulating material 68.

At this time, the electrically insulating material 68 is melted by neither the heating temperature nor the applied current. The heating is only for giving the conductive property to the insulating coat 1*b*. The junction between the semiconductor material 1*a* and the electrically insulating material 68 can be achieved only with the positive current flowing from the semiconductor material 1*a* to the electrically insulating material 68.

FIG. 57 is an illustration for describing one example of a method of anode-junctioning two semiconductor materials 1*c*, 1*d* made of silicon with an electrically insulating material 68, as disclosed again Japanese Patent Publication No. 53-28747. In this method, the two semiconductor materials 1*c* and 1*d* whose function surfaces are attached onto the insulating coat 1*b* are placed on the electrically insulating material 68 which in turn, is mounted on the resistance heating strip 67. The semiconductor materials 1*c* and 1*d* are respectively equipped with direct-current power supplies 61, 62 for causing positive currents to flow, and the positive electrode terminals of the direct-current power supplies 61, 62 are connected to the corresponding semiconductor materials 1*c*, 1*d*, respectively, while the negative electrode terminals thereof are in common to the resistance heating strip 67.

Furthermore, in the anode junction method, the resistance heating strip 67 will heat the semiconductor materials 1*c*, 1*d* through the electrically insulating material 68 so that the insulating coat 1*b* has a slight electrical conductive property. As a result a small positive current (for example, several $\mu A/mm^2$) flows for about one minute from the semiconductor materials 1*c*, 1*d* to the electrically insulating material 68, whereby an anode growth oxide junction takes place in the boundary between the semiconductor materials 1*c*, 1*d* and the electrically insulating material 68, thus completing the anode junction between the semiconductor materials 1*c*, 1*d* and the electrically insulating material 68.

As examples of general application of the anode electrode junction method disclosed in other publications, Japanese Patent Publication Nos. 1-185242 and 4-146841 disclose a method wherein the silicon surface of the rear surface of a silicon wafer is used as an electrically conductive surface which in turn, is junctioned with a surface of a glass wafer.

Japanese Patent Publication No. 53-28747 exemplifies, as a semiconductor, a junction between silicon and quartz, a junction between silicon and boro-silicate glass made of boric acid and silicic acid which is a heat resistance glass having a low expansion coefficient, a junction between a germanium semiconductor and a boro-silicate glass, and a junction between silicon and sapphire.

Moreover, as an example of special application Japanese Patent Publication No. 63-117233 discloses a method of anode-junctioning a silicon wafer with a silicon supporting wafer in a capacity type pressure sensor. A detailed description of the principle of the anode junction method will be omitted here as it is made in the Japanese Patent Publication No. 53-28747 and others.

FIG. 58 is a plan view showing a conventional laminated multi-layer insulating substrate, and FIG. 59 is a cross-sectional perspective view showing the longitudinal structure of FIG. 58. In FIG. 58, numeral 70 designates a laminated multi-layer insulating substrate, numeral 71 depicts an insulating plate, and 76 stands for wiring patterned on the insulating plate 71. Further, in FIG. 59, numerals 71 to 75 indicate five insulating plates stacked up, and numerals 76 to 81 and the black-colored portions represent wiring patterned on the insulating plates 71 to 75, respectively. For formation of the laminated multi-layer insulating substrate 70 by stacking up the insulating plates 71 to 75 on top of each other, lead wires are inserted into through-holes formed in the insulating plates 71 to 75 and electrically coupled to the wiring of the insulating plates 71 to 74 stacked on each other.

The joining method of the conventional technology were described above in the following order the wire bonding method, the bump junction method by the TAB and anode junction method which have been known as prior junction techniques, while the anode junction method has been known as means to coat the chip surface with an insulating film as well as to junction a silicon making up a strain gage with a base used for the stress relaxation in a pressure sensor.

In a conventional anode junction method generally used, the silicon itself to be junctioned with a glass insulating plate has some degree of rigidity and for the junction a glass insulating plate is used which also has the some degree of rigidity as the silicon has.

In the above description, the wire bonding method must include 1) the formation of the ball, 2) the heating, application of pressing force, and supply of ultrasonic vibration in the ultrasonic thermocompression bonding, 3) the movement of the capillary, 4) the ultrasonic thermocompression bonding for the stitch portion, and 5) practicing the five processes for cutting the gold line even for one inner lead. Even in the bump junction by TAB 1) the heating compression bonding, and 2) the moving process repeated by the number of the electrode junctions must be carved out. The collective bonding is still not put into practice. In these junction methods, the electrode and the electrode to be electrically connected to each other, i.e., a metallic conductor and a metallic conductor are made to be joined with each other by the ultrasonic thermocompression bonding or thermocompression bonding. For this reason, the mechanical strength of the junctioned portions to be electrically connected to each other, for example, the shear strength, depends upon the state of the junctioned portions.

In addition, the portions that are ultrasonic thermocompression-bonded or thermocompression-bonded constitute an alloy layer due to being organizationally broken and rejoined by the metal contact frictional heating and the applied load, constitute an alloy layer. Accordingly, a safe strength can not be ensured except where area of the junction is large. For instance, when the diameter of the gold line is $\phi=25$ $\mu$m, the diameter $\phi$ of the contact surface of the junctioned portion is set to be $\phi=100$ $\mu$m. That is, the diameter becomes four times and the area becomes sixteen times that of the gold line.

The following problems arise with the conventional contact methods for the electrode and the inner lead.

a) In the case of the conventional method in which the connection between the electrode and the inner lead is made through a gold line having an extremely low rigidity, it is necessary to provide mechanical strength to both end portions of the gold line to be electrically connected, so that the dimension of the connected portion needs to exceed the value necessary for the electrical connection. As a result, the dimensions of the electrodes on the chip must which goes be large against the object of increasing the degree of the density of integrated circuits (IC). This became a to miniaturizing IC chips.

b) In the case of the prior method wherein the junction between the inner lead and the electrode is made through a member such as the gold line having an extremely low rigidity, it is necessary that the semiconductor chip and the inner lead are molded in order to protect both the end portions of the gold line to be electrically coupled and the gold line itself against the external loads or to protect the semiconductor chip itself against the external environment. Accordingly, increasing the outer dimensions of the semiconductor device to a given value is unavoidable.

c) Because of the recent high integration of ICs, number of electrodes for taking signals to the exterior is increasing. However, in the conventional wire bonding method or bump junction method by TAB, in order to ensure the mechanical junctioning strength to some extent, the dimension of the electrode needs to be increased up to a predetermined dimension, with the result that the dimension of the entire chip depends upon the number of electrodes, thus becoming a barrier to miniaturizing IC chips.

d) In cases where the number of connection pins formed by extending the inner leads up to the outside of the sealing section is above 100, even if the connection accuracy varies because of the wire bonding method in which the joining work is carried out for each of the electrodes, difficulty is experienced in checking whether or not the contacts with the electrodes are normal.

e) Since it is difficult to know the accurate value of the mechanical strength of the alloy layer made at the junctioned portion through the ultrasonic thermocompression bonding or the thermocompression bonding, it is necessary to design the junctioned portion with a high safety factor. For this reason, a sufficient over-design is required taking into account vibration during the assembly process, empty weight and other external forces into consideration, and hence a limitation on designing occurs.

f) In a conventional electrode connecting method, the connecting work needs to be repeatedly done the some number of times as the number n of the electrodes or twice the number n of electrodes (2n). For this reason, as the number of the pins in the semiconductor device increases, the time required for the connections increases.

SUMMARY OF THE INVENTION

It is therefore an object of this invention to provide an electronic component and a method of manufacturing the electronic component which are capable of making an electrical connection between an inner lead and an electrode, providing a strong mechanical junction between the inner lead and an insulating film around the electrode, and collectively bonding the inner lead to each of a plurality of electrodes according to the anode junction method.

It is another object of the present invention to provide an electronic component in which inner leads or electrodes are directly connected with outer leads.

According to a first aspect of the invention, an electronic component comprises an electrical conductor for inputting and outputting a current, a circuit element having electrodes to be electrically connected, an insulating coat, which has a conductive property when being subjected to heating, adhered to a portion around the electrodes, before the electrical conductor is brought into contact with the electrodes and layed on said insulating coat with the insulating coat and the electrodes being anode-junctioned together so that the electrical conductor and the electrodes became electrically connected to each other. This allows the electrical conductor to be connected to the circuit element with a mechanical firmness without being melted, and improves the degree of electrical coupling of the electrical conductor with the electrodes.

According to a second aspect of the invention, an electronic component comprises an insulating coat having a conductive property when being subjected to heating and adhered onto a portion of a surface of a semiconductor chip other than electrodes formed on the semiconductor chip, a tip portion of an inner lead extending from a lead frame being layed on the insulating coat so that the insulating coat and the tip portion of the inner lead are anode-junctioned with each other to make the inner lead electrically coupled to the electrode. This allows the inner lead to be joined onto the semiconductor chip with a mechanical firmness, as well as improves the degree of electrical coupling of the inner lead with the electrode.

According to a third aspect of the invention, in an electronic component, a metallic coat is attached onto an insulating passivation film formed on a surface of a semiconductor chip. This permits the semiconductor chip that is to be used as an anode to be anode-junctioned with a wiring substrate, and further allows avoided the influence from electromagnetic waves or the like to be became the uppermost surface of the semiconductor chip is covered by the metallic coat.

According to a fourth aspect of the invention, in an electronic component, the surface of an electrode on a semiconductor chip is positioned to be higher than the uppermost surface of an insulating coat attached onto the semiconductor chip surface and having an electrical conductive property when being heated, with the result that the degree of electrical coupling between the insulating coat and the inner lead to be anode-junctioned improves.

According to a fifth aspect of the invention, in an electronic component, a tip portion of an electrode is made to have a convex configuration. With this structure, when the inner lead and the insulating coat are anode-junctioned with each other, the top of the electrode becomes easy to break along the inner lead, thus improving the degree of electrical coupling and making it easy to adjust the height of the top thereof.

According to a sixth aspect of the invention, in an electronic component, the surface of an electrode on a semiconductor chip is positioned to be lower than the uppermost surface of an insulating coat having an electrical conductive property when being heated that is attached onto the semiconductor chip surface. With this structure, it is possible to place a conductive material in the low portion to make the conduction between the inner lead and the electrode sure.

According to a seventh aspect of the invention, in an electronic component, a conductive material with a low elastic modulus is placed on an electrode that is positioned on a surface lower than a surface of an insulating coat having a conductive characteristic when being subjected to heating, with a portion of the conductive material protruding from the surface of the insulating coat. With this structure, the degree of conduction between the electrodes and the inner lead is improved due to the conductive material.

According to an eighth aspect of the invention, in an electronic component, the foregoing conductive material with a low elastic modulus is mercury. When the mercury ball is compressed, the contact areas among the mercury, the inner lead and the electrode become larger, thereby improving the degree of conduction between the electrodes and the inner lead.

According to a ninth aspect of the invention, in an electronic component, an insulating coat, which has a conductive property when being heated, is adhered onto a portion of a surface of an inner lead anode-junctioned onto a semiconductor chip and is placed on a wiring conductor of a circuit substrate so that the insulating coat and the wiring conductor are anode-junctioned with each other. With this a structure, it is possible to mount the semiconductor chip on the circuit substrate without drawing an external connection lead out of the semiconductor chip.

According to a tenth aspect of the invention, in an electronic component, an end portion of an inner lead anode-junctioned onto a semiconductor chip is bent along an edge of the semiconductor chip to make an out lead. This structure allowed a smaller-sized semiconductor device to be provided.

According to an eleventh aspect of the invention, there is provided an electronic component manufactured according to this invention, wherein an insulating coat which has a conductive property when being subjected to heating is adhered onto a surface of a semiconductor chip so as to avoid the electrodes on the semiconductor chip, and the semiconductor chip is mounted on a circuit substrate on which, in addition to a wiring conductor electrically joined with the electrodes, a conductive piece is patterned to come into contact with the insulating coat, and the insulating coat and the conductive piece are anode-junctioned with each other to make an electrical contact between the electrodes and the wiring conductor. With this structure, the mechanical contact of the semiconductor chip with the circuit substrate becomes strong, while the electrical connection between the electrodes and the wiring conductor becomes firm.

According to a twelfth aspect of the invention, there is provided an electronic component manufactured according to this invention, wherein an insulating coat which has a conductive property when being heated is adhered onto a conductive piece patterned to be insulated from a wiring conductor patterned on a first circuit substrate, and a wiring conductor electrically coupled to the first-mentioned wiring conductor and a conductive piece insulated from the second-mentioned wiring conductor are patterned on a second circuit substrate which in turn, is staked on the first circuit substrate, before the insulating coat and the conductive piece are anode-junctioned with each other, thus creating a laminated circuit substrate. This structure can offer a laminated wiring substrate having a high dimensional accuracy in thickness.

According to a thirteenth aspect of the invention, an electronic component manufactured according to this invention is constructed such that an insulating coat which has a conductive property when being subjected to heating is adhered onto a portion of a wiring conductor contacting portion of an out lead of a semiconductor device and disposed on a wiring conductor of a circuit substrate so that the insulating coat and the wiring conductor are anode-junctioned with each other to mount the semiconductor device on the circuit substrate. This structure allows a plurality of semiconductor devices to be simultaneously mounted on the wiring substrate.

According to a fourteenth aspect of the invention, an electronic component manufactured according to this invention is made such that a projection is provided on a tip portion of an inner lead and an insulating coat which has a conductive property when being heated is attached onto a portion around the projection, and a metallic coat is adhered onto a portion around an electrode on a semiconductor chip with a predetermined thickness to form a crater reaching the electrode, the projection being engaged with the crater to make a contact between the inner lead and the electrode so that the insulating coat and the metallic coat are anode-junctioned with each other. This structure make the contact between the inner lead and the electrodes strong.

According to a fifteenth aspect of the invention, an electronic component manufactured according to this invention is made such that an opening extending to an inner lead is formed in an insulating coat attached onto a tip portion of the inner lead and having a conductive property when heated, to create a crater which is engaged with a convex electrode protruding from a metallic coat on a surface of a semiconductor chip to make the inner lead and the electrodes come into contact with each other so that the insulating coat and the metallic coat are anode-junctioned with each other. This can make the contact between the inner lead and the electrodes strong.

According to a sixteenth aspect of the invention, an electronic component manufactured according to this invention is made such that an insulating coat which has a conductive property when being heated is adhered onto a rear surface of a semiconductor chip and the semiconductor chip is placed on a die pad of a lead frame, before the insulating coat and the die pad are anode-junctioned with each other to fix the lead frame pad onto the semiconductor chip. This structure makes the die bonding material unnecessary, thereby making it possible to manufacture a semiconductor device at a low cost.

According to a seventeenth aspect of the invention, in a method of manufacturing an electronic component, an insulating coat which has a conductive property when being heated is adhered onto the entire surface of a semiconductor chip other than the electrodes, before a tip portion of each of the inner the leads is positioned or aligned with a top surface of a corresponding electrode, and the electrodes and the inner leads are simultaneously electrically connected to each other when the inner leads and the insulating coat are joined with each other according to the anode junction method. Thus, each inner lead can be mechanically and firmly joined with the semiconductor chip over a wide range, and the inner leads and the electrodes can be coupled electrically with each other.

According to an eighteenth aspect of the invention, in a method of manufacturing an electronic component, an insulating coat which has a conductive property when being heated is built-up on a surface of a semiconductor chip formed by division of a semiconductor wafer into a plurality of sections except on the electrode so as to form craters around the electrodes, and a conductive material with a low elastic modulus is fitted in the craters so that a portion thereof is exposed, and a tip portion of an inner lead of a lead frame is positioned on a top surface of each electrode so that the inner lead and the insulating coat are joined with each other according to an anode junction method. The inner leads and the electrodes are electrically coupled to each other while the conductive material is brought into contact with the electrodes under a pressure by the inner lead when the insulating coat is junctioned with the inner lead. With this structure, the conductive material can enlarge the contact area between the inner leads and the electrodes as well as improve the degree of coupling therebetween.

According to a nineteenth aspect of the invention, in a method of manufacturing an electronic component, an insulating coat which has a conductive property when being heated is adhered onto a portion around a bump provided on an electrode section of a semiconductor chip, and the bump at the electrode section is placed on an inner lead formed by etching a TAB automatic mounting flexible tape, before the insulating coat and the inner lead are anode-junctioned with each other so as to electrically couple the electrode through the bump to the inner lead. This can connect the semiconductor chip to the inner lead with less processes than the conventional TAB automatic mounting.

According to a twentieth aspect of the invention, in a method of manufacturing an electronic component, an insulating coat which has a conductive property when being heated is adhered onto a bottom surface of a semiconductor device with an external wiring ball grid array so that a top portion of the ball grid array is exposed, before the ball grid array is located on a wiring conductor on a circuit substrate to carry out an anode junction between the insulating coat and the wiring conductor so that the ball grid array and the wiring conductor are electrically connected to each other. Since the ball grid array and the wiring conductor are electrically connected with each other in the process of the anode junction, even if the semiconductor device has a multi-pin structure, it is possible to mount the semiconductor device on the wiring substrate in short time with less processing.

According to a twenty-first aspect of the invention, there is provided an electronic component comprising: an electrical conductor for inputting and outputting a current; a circuit element having an electrode thereon, an insulating coat for anode junction which has a conductive property when being heated being adhered onto a portion of the circuit element around the electrode; and an anode junctioning section for anode-junctioning the conductor with the insulating coat to cover the electrode. With this structure, it is possible to achieve a mechanically firm junction between the conductor and the circuit element without needing necessary to melt the conductor, as well as to increase the degree of electrical coupling of the conductor to the electrodes.

According to a twenty-second aspect of the invention, there is provided an electronic component comprising: a semiconductor chip having electrodes thereon, an insulating coat for anode junction which has a conductive property when being heated being adhered onto a portion of the circuit element other than the electrodes; a lead frame having inner leads to be electrically connected to the electrodes; and an anode junctioning section for anode-junctioning the inner leads with a surface of the semiconductor chip to cover the electrode. With this structure, it is possible to accomplish the mechanically firm junction of the inner leads onto the semiconductor chip, as well as to increase the degree of electrical coupling of the inner lead to the electrodes.

The above and other objects, features, and advantages of the invention will become more apparent from the following description when taken in conjunction with the accompanying drawings.

DESCRIPTION OF THE PREFERRED EMBODIMENT

First Embodiment

Figure 1:
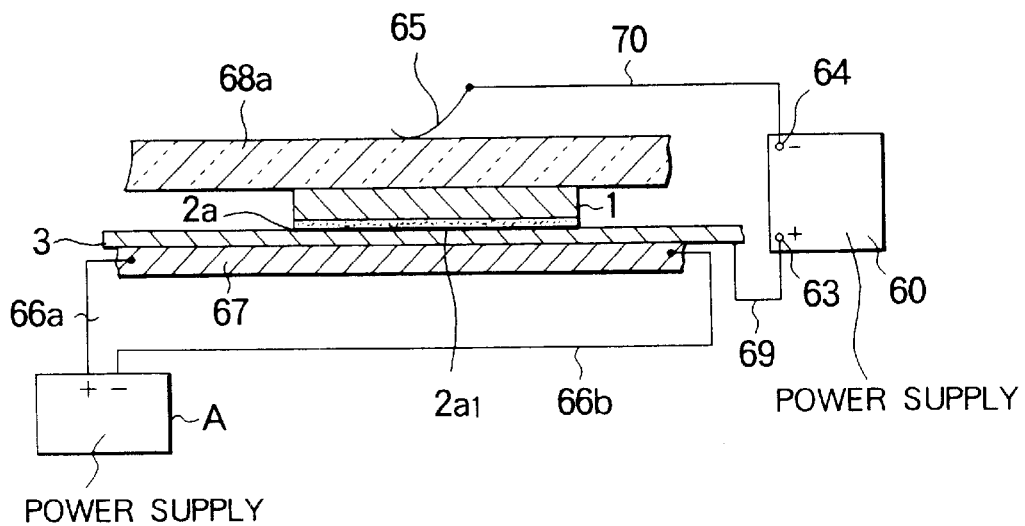
FIG. 1 is a cross-sectional view showing a semiconductor chip for describing an anode junction method according to an embodiment of the present invention.
Figure 42:
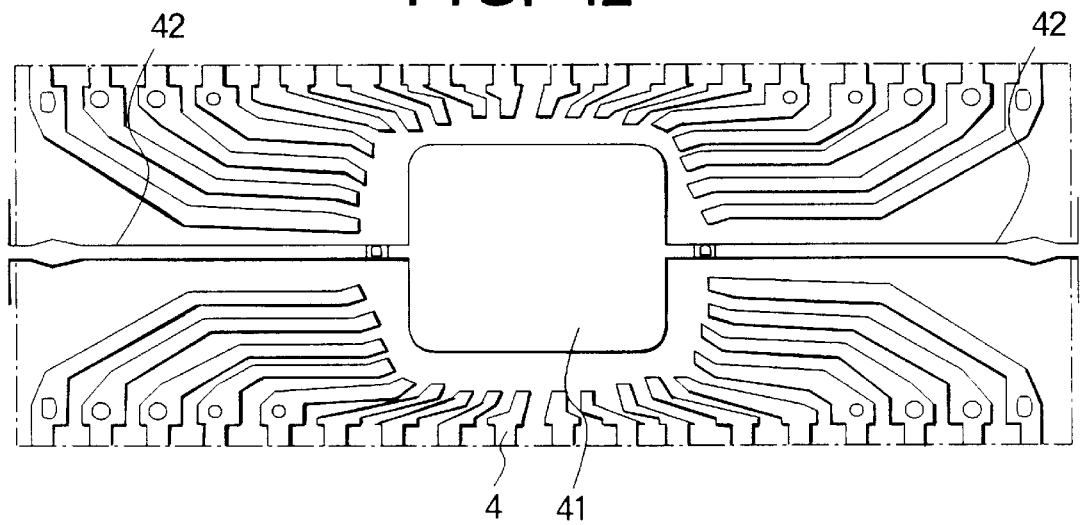
FIG. 42 is an enlarged plan view showing an inner lead section of a conventional lead frame.
Figure 56:
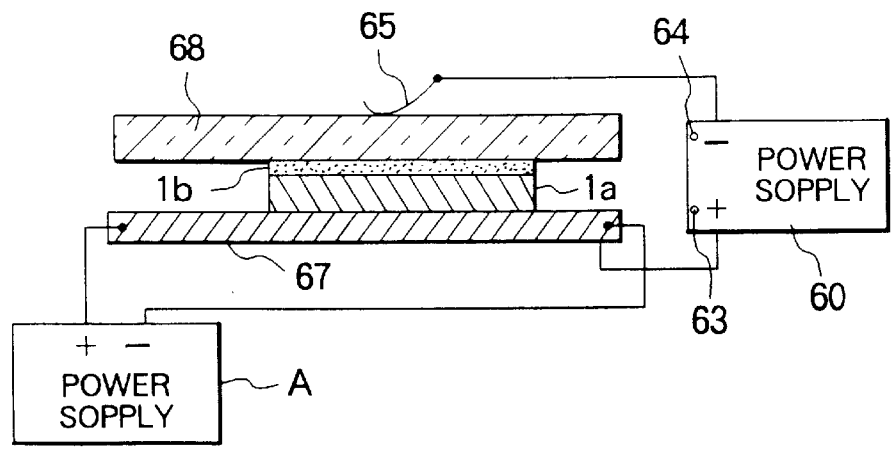
FIG. 56 is an illustration for describing an anode junction method.
Figure 57:
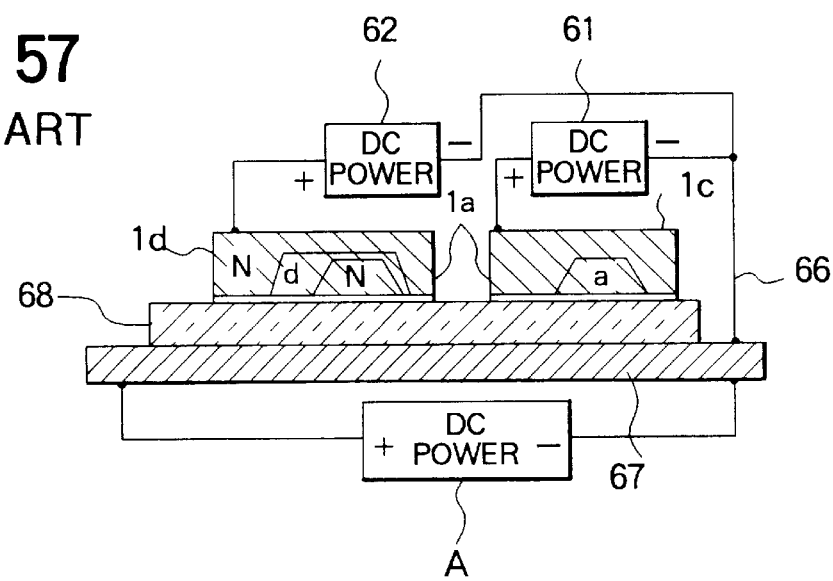
FIG. 57 is an illustration for describing another anode junction method.
Figure 58:
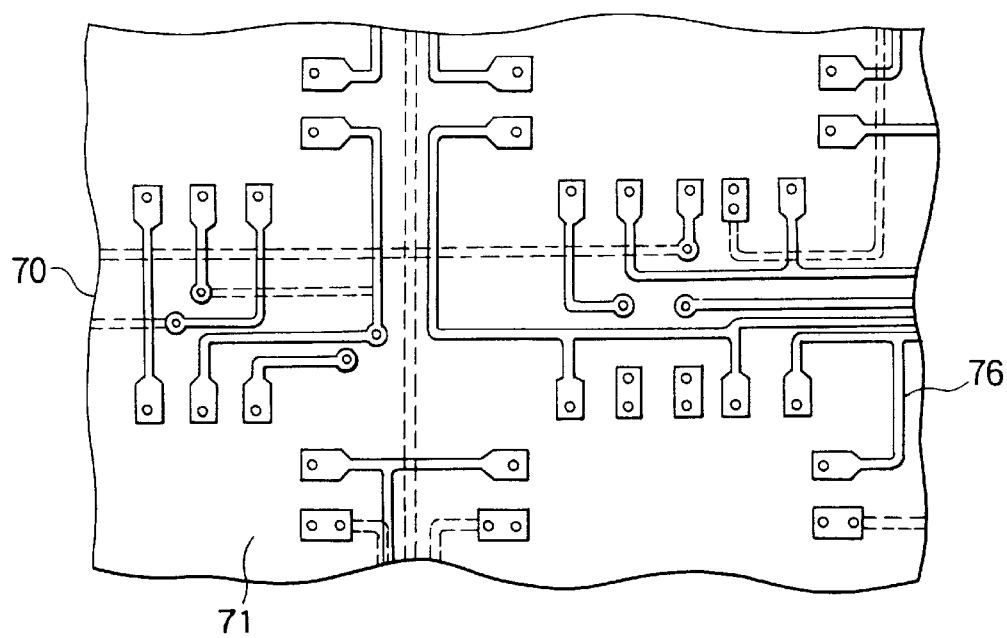
FIG. 58 is a plan view showing a conventional wiring substrate to be used for a laminated multi-layer substrate.
Figure 59:
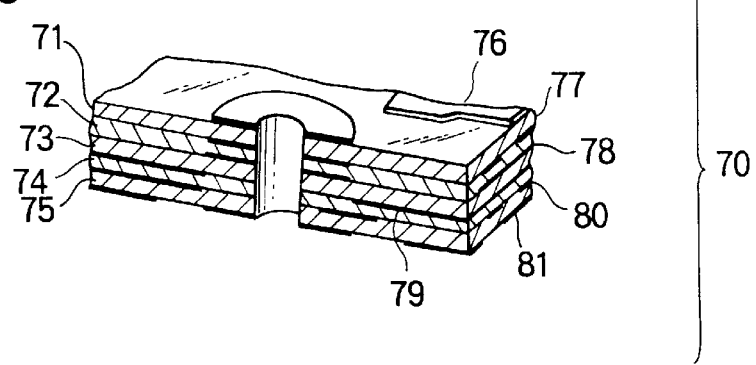
FIG. 59 is a cross-sectional view showing a conventional laminated multi-layer substrate.

A description will be made hereinbelow in terms of an embodiment of this invention. FIG. 1 is a side elevational and cross-sectional view of an anode junctioning means and semiconductor chip for describing a method of anode-junctioning an inner lead with each electrode of a semiconductor chip, where parts corresponding to those in FIG. 56 are marked with the same reference numerals. In the illustration, numeral 1 represents a semiconductor chip, and numeral 2a designates an insulating coat made of a glass material and adhered onto portion of a surface of the semiconductor chip 1 other than the electrode portions by means of a sputtering method, the insulating coat showing a conductive property when being subjected to heating. It is preferable that a boro-silicate glass (generally used for a flasks, etc) made of boric acid and silicic acid is used as the glass material. One reason is that, since the coefficient of linear expansion of the boro-silicate glass is substantially equal to the coefficient of linear expansion of the electrical insulating film made of a silicon oxide and provided on the semiconductor chip 1, it is difficult for the glass material to peel off from the electrical insulating film even when the insulating film cools off. Further, numeral 3 denotes a lead frame having a configuration as shown in FIG. 42. In the case of the lead frame 3 in this embodiment, a die pad 41 and suspended leads 42 (indicated by broken lines) which have been needed for mounting the semiconductor chip become unnecessary, because the inner leads 4 are directly anode-junctioned with the semiconductor chip 1. In FIG. 1, the semiconductor chip 1 is positioned at the central portion of the area in which the conventional die pad 41 is provided. In addition, each inner lead 4 is made to extend up above each electrode of the semiconductor chip 1 as shown in FIG. 3.

Figure 3:
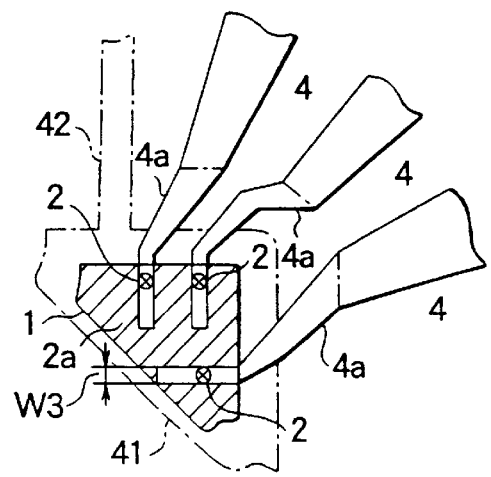
FIG. 3 is a plan view showing a state in which electrodes of a semiconductor chip are joined with inner leads of a lead frame in accordance with the anode junction method according to this embodiment.

Furthermore, in FIG. 3, the positions of the tip portions of the conventional inner leads 4 are indicated by respective broken lines, and inner leads 4a in this embodiment as the portions extending from the broken lines position. The tip portion of each of the inner leads 4a extends so as to cross over an electrode 2 formed on the top surface of the semiconductor chip 1. In the same illustration, the tip portion of each of the inner leads 4a, painted out in black, is anode-junctioned with the insulating coat 2a on the semiconductor chip 1, while the electrode 2 is pressed by the rear surface of the inner lead 4a to make an electrical connection therebetween. That is, when the inner lead 4a is joined with the insulating coat 2a, the joining surface of the inner lead 4a is pressed against the surface of the electrode 2 protruding several microns from the insulating coat 2a thus making the electrical connection.

With the above-mentioned structure, when a current due to a power supply A flows through power leads 66a, 66b into a resistance heating plate 67, the resistance heating plate 67 generates heat to heat, through the lead frame 3, the insulating coat 2a up to approximately 400° C.±50° C., whereby result in a conductive property the insulating coat 2a. When a direct-current voltage is applied between the lead frame 3 and a positioning jig 68a while conductively tied together from a direct-current power supply 60, a positive current flows between the insulating coat 2a and the lead frame 3. As a result, an electrostatic adhesive strength and electrochemical bonding strength take place at the boundary plane 2a1 (indicated by a thick line under the insulating coat 2a) between the insulating coat 2a and the lead frame 3 so that the inner leads at the tip portion of the lead frame 3 are anode-junctioned with the semiconductor chip surface.

For the electrical connection between the inner leads 3 and the electrodes 2 of the semiconductor chip 1, as shown in FIG. 3, the tip portion of the inner lead 4a, painted out in black, is anode-junctioned with the insulating coat 2a on the semiconductor chip 1, while the electrode 2 is pressed by the rear surface of the inner lead 4a to make the electrical connection therebetween. That is, when the inner lead 4a is joined with the insulating coat 2a, the joining surface of the inner lead 4a is pressed against the surface of the electrode 2 protruding several microns from the insulating coat 2a, thus making the electrical connection.

Figure 2:
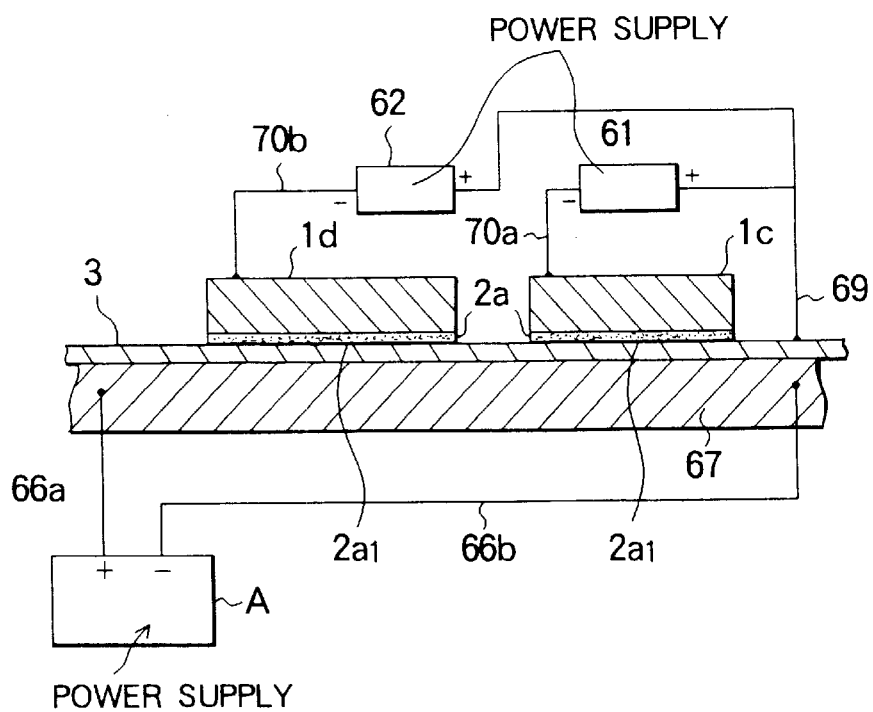
FIG. 2 is a cross-sectional view showing a semiconductor chip for describing an anode junction method according to an embodiment of the present invention.

FIG. 2 is an illustration for describing a method of simultaneously anode-junctioning a plurality of semiconductor chips 1 with a lead frame 3. In the illustration, numeral 61 represents a direct-current power supply for causing a positive current to flow into the insulating coat 2a of one semiconductor chip 1 and the lead frame 3, and numeral 62 designates a direct-current power supply for causing a positive current to flow into the insulating coat 2a of the other semiconductor chip 1 and the lead frame 3. In the illustration, the two semiconductor chips 1d, 1c are placed on the lead frame 3 and simultaneously anode-junctioned therewith, and using the two direct-current power supplies 61, 62, positive currents are designed to flow between the semiconductor chips 1d, 1c and the lead frame 3. In this case, if the semiconductor chips 1c, 1d can accurately be positioned relative to the lead frame 3 by some means, there is no need for a positioning jig 68a to be used as a pressing jig, positioning jig and common short-circuit conductive piece as shown in FIG. 1. In the case of this method, it is possible to merely give a positive current in a state in which the insulating coat 2a side is treated as a cathode and the lead frame 3 being a metallic conductor is treated as an anode. In addition, it is also appropriate that a positive potential be applied from direct-current power supplies so that a single or a plurality of collets (vacuum adsorbers), not shown, for adsorbing the lead frame 3 can become an anode. In this case, using a single direct-current power supply is possible.

Figure 4:
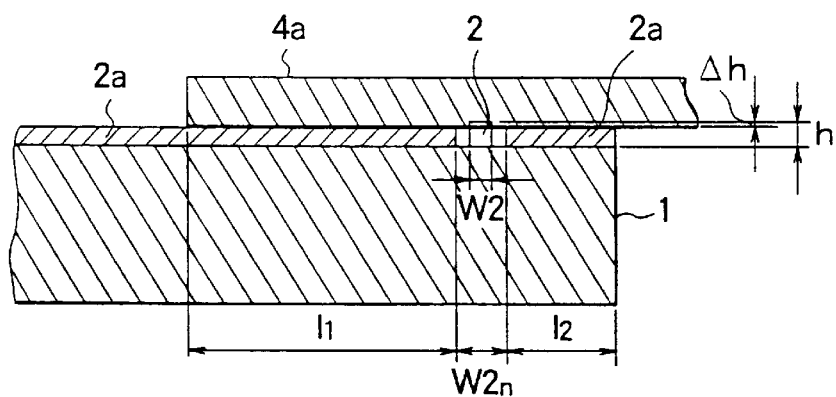
FIG. 4 is a cross-sectional view showing a state in which electrodes of a semiconductor chip are joined with inner leads of a lead frame in accordance with the anode junction method according to this embodiment.

FIG. 4 is a cross-sectional view of a semiconductor chip 1, showing a portion to be anode-junctioned, the central portion of the inner lead 4a having a width of W3 in FIG. 3 being cut away longitudinally. In FIG. 4, numeral 2 depicts a rectangular parallelepiped electrode having a side width of W2 and a height of h. Around this electrode 2 there is formed a square opening section having a side of W2n. The insulating coat 2a is adhered onto a portion other than this opening section on the semiconductor chip 1. Accordingly, a gap of W2n–W2 is produced between the electrode 2 and the insulating coat 2a. A chain line portion indicated by a dimension h denotes a vertical dimension of the electrode 2 before being pressed and deformed by the inner lead 4a at the anode junction, the top thereof protruding by $\Delta h$ from the insulating coat 2a surface. Accordingly, the insulating coat 2a is adhered onto the semiconductor chip surface to have a thickness of (h−$\Delta h$).

Furthermore, when the anode junction is completed and the electrode 2 is pressed, the electrode 2, as shown by a solid line in FIG. 4, has a height of (h−$\Delta h$). When being pressed, the electrode 2 is crushed so that its transverse dimension naturally becomes wider, while, since a space W2n−W2 exists between the electrode 2 and the insulating coat 2a, the increase in this dimension does not affect the insulating coat 2a.

Figure 5:
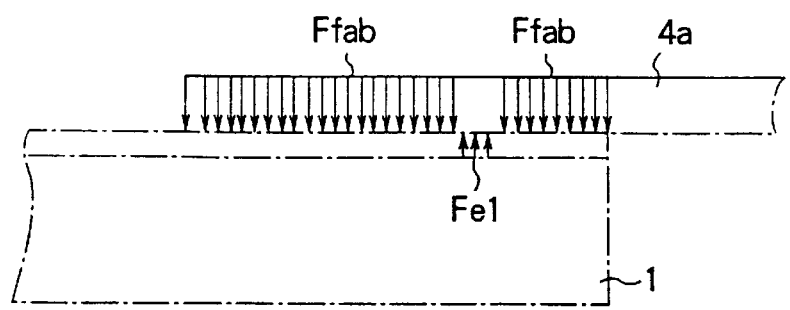
FIG. 5 is a cross-sectional view of a semiconductor chip for describing a distribution of a load to be applied from an inner lead onto a semiconductor chip surface at an anode junction.

However, when the electrode 2 is actually pressed so that a compression strain of $\Delta h/h$ occurs, the increasing quantity $\Delta W$ in the width W2 of the electrode 2 is $\Delta W = v \times (\Delta h/h)$. At this time the Poisson ratio v of the electrode 2 is on the order of approximately 0.3, so that, if the increasing quantity $\Delta W$ can be treated at the designing stage so that it can be disregarded, it will be possible to set as W2n=W2 is possible. In fact, the portion at which the inner lead 4a and the insulating coat 2a are anode-junctioned with each other is in the range of the anode-junctioning areas 11 and 12 between which the opening section with the width W2n is interposed. Next, a detailed description will be made with reference to FIG. 5 in regard to the anode junctioning force produced in the anode-junctioning areas 11 and 12 and the reaction force generated in the electrode 2. FIG. 5 is an illustration for describing the relationship between the anode junctioning force Ffab occurring against the insulating coat 2a and the reaction force Fe1 taking place from the electrode 2. The size of the electrode 2 is designed so that the magnitude of the anode junctioning force Ffab becomes larger as compared with the reaction force Fe1 produced as a reaction due to the electrode compression (Ffab>Fe1), where the reaction force Fe1 is always made to be exposed to the static simple compression.

Furthermore, since the anode-junctioning areas 11 and 12 are not equal to each other, although in FIG. 5 the reaction force Fe1 is not illustrated as occurring at the center of the total anode junctioning force Ffab, ideally it is desirable that Fe1 occurs at the center of Ffab, that is, the electrode 2 is at the center of the anode junctioning portion of the inner lead 4a. If design permits the electrode 2 to be subjected to a moment and compression, the Fe1 can be set to a portion other than the center of Ffab.

When anode-junctioned, the reaction force Fe1 occurring in the electrode 2 is expressed as Fe1=E×($\Delta h/h$)×W2×W2 which is proportional to $\Delta h/h$ where E represents an elastic modulus (Young's modulus) depending upon the physical property (property of matter) of the material of the electrode 2.

The anode junctioning force Ffab is the actually measured result of the tensile breaking strength of the junction surface made when a boro-silicate glass being the insulating coat 2a and a silicon are junctioned with each other. The boro-silicate glass and the silicon are strongly junctioned with each other to the extent that the glass base material is broken. The anode junctioning strength is considered $\sigma fab \geq 4$ kgf/mm$^2$, and the junctioning force Ffab due to the anode junction becomes $\{W3 \times (l1+W2n+l2) - W2n \times W2n\} \times \sigma fab$. Now, considering the ratio Ffab/Fe1 of the anode junctioning force to the reaction force, this value must become greater than 1. The ratio Ffab/Fe1 can be expressed in accordance with the following equation.

$$Ffab/Fe1 = [\sigma fab \times \{W3 \times (l1+W2n+l2) - W2n \times W2n\}]/[E \times (\Delta h) \times W2 \times W2] \quad (1)$$

When aluminium is employed as the material of the electrode 2, if E=6300 kgf/mm$^2$, Ffab/Fe1 can be expressed by the following equation.

$$Ffab/Fe1 = [4 \times \{W3 \times (l1+W2n+l2) - W2n \times W2n\}]/[6300 \times (\Delta h) \times W2 \times W2] \quad (2)$$

Since the breaking strength of the electrode 2 is 7 kgf/mm$^2$, if the displacement of the electrode 2 is limited to within the plastic deformation area when the electrode 2 is subjected to a compressing force, the value obtainable as $\Delta h/h$ becomes below less than $1.1 \times 10^{-3}$. Accordingly, the breaking strength is doubled to give some allowance, and when the dimension of each part is determined as $\Delta h/h = 5 \times 10^{-4}$, Ffab/Fe1 is given as follows.

$$Ffab/Fe1 = 1.27 \times \{W3 \times (l1+W2n+l2) - W2n \times W2n\}/\{W2 \times W2\} \quad (3)$$

Since W3$\geq$W2n$\geq$W2, if W3, W2n and W2 are almost equal to each other, the minimum Ffab/Fe1 can be obtained from the following equation.

$$Ffab/Fe1 = [1.27 \times \{(l1+W2n+l2)/W2\} - 1] > 1 \quad (4)$$

Accordingly, the only requirement is that the above-mentioned condition be satisfied. As shown in FIG. 4, it is possible for (l1+W2n+l2) to be set greater than W2.

In this embodiment, if W3, l1+l2+W2n and W2 are determined so as to satisfy the above-mentioned condition, when in an aluminium electrode $\Delta h/h$ is set to $5\times 10^{-4}$ from the relation of $(W2n-W2)/W2 \geq v \times \Delta h/h$, there results in $W2n>1.000165\times W2=W2+1.65\times 10^{-4}\times W2$ from v=0.33. When W2n is set to be greater than W2, the dimension of W2n becomes $1.65\times 10^{-4}$ times W2, and hence the only requirement is that the opening section be formed to have a dimension smaller than the dimension of the electrode 2.

Employing $\Delta h/h=5\times 10^{-4}$, the thickness of the insulating coat 2a needs to be $h-\Delta h=0.9995\times h$. Generally, when the thickness of the insulating coat 2a is set to 25 $\mu$m, the design is satisfactory when the height of the electrode is set to h=25.0125 $\mu$m, and it is higher by 125 angstroms than the height of the insulating coat 2a.

In the above, $\Delta h/h$ is designed to be within the plastic deformation area of the material of the electrode 2 and the dimension is determined so that $\Delta h/h=5\times 10^{-4}$. Accordingly, since the difference between the heights of the insulating coat and the electrode is as small as $25\times 5\times 10^{-4}$, the height of the electrode 2 must be accurately.

Figure 6A:
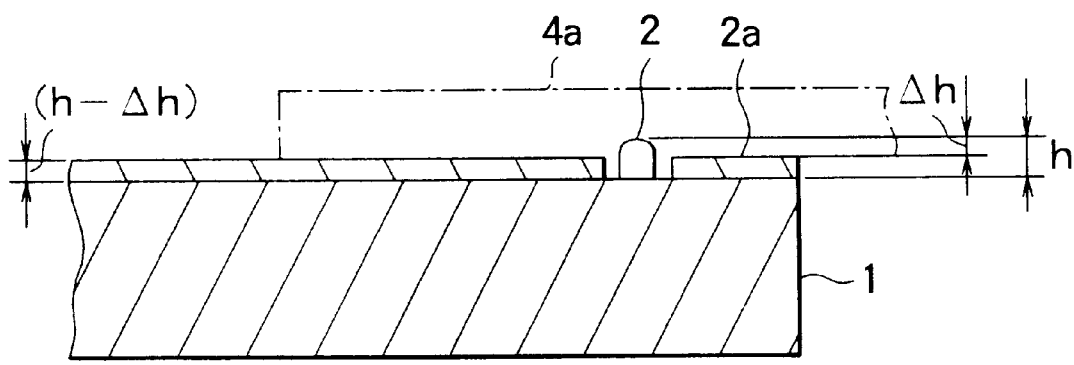
FIGS. 6A and 6B are cross-sectional views of semiconductor chips, showing the configuration of an electrode formed on the semiconductor chip.
Figure 6B:
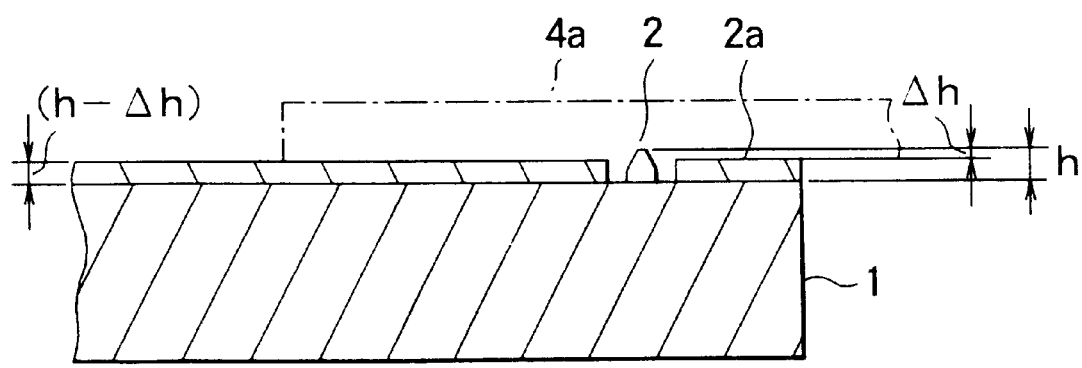
Figure 7A:
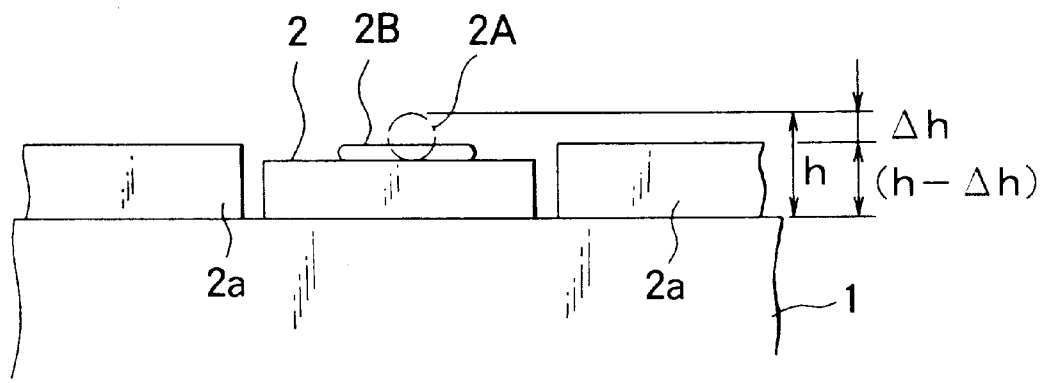
FIGS. 7A and 7B are cross-sectional views of semiconductor chips, showing a configuration of an inclusion of a conductive material placed between an inner lead and an electrode and further showing a configuration after deformation thereof.
Figure 7B:
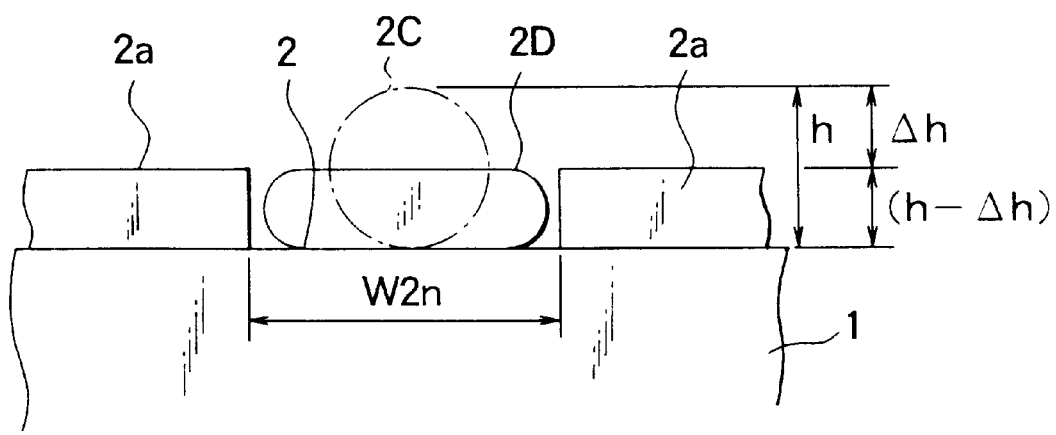

When an electrode 2 is used exceeding the plastic deformation area, since the height of the electrode is adjustable by lowering the accuracy during manufacture, the contact surface of the electrode 2 may have a spheroidal configuration as shown in FIG. 6A or trapezoidal shape as shown in FIG. 6B. Further, it is also appropriate that as shown in FIGS. 7A, 7B and 8 a spheroidal soft conductor (for example, solder) is placed on the electrode surface so that the inner lead and the electrode are electrically connected to each other through the soft conductor, which will be described hereinafter.

Figure 8:
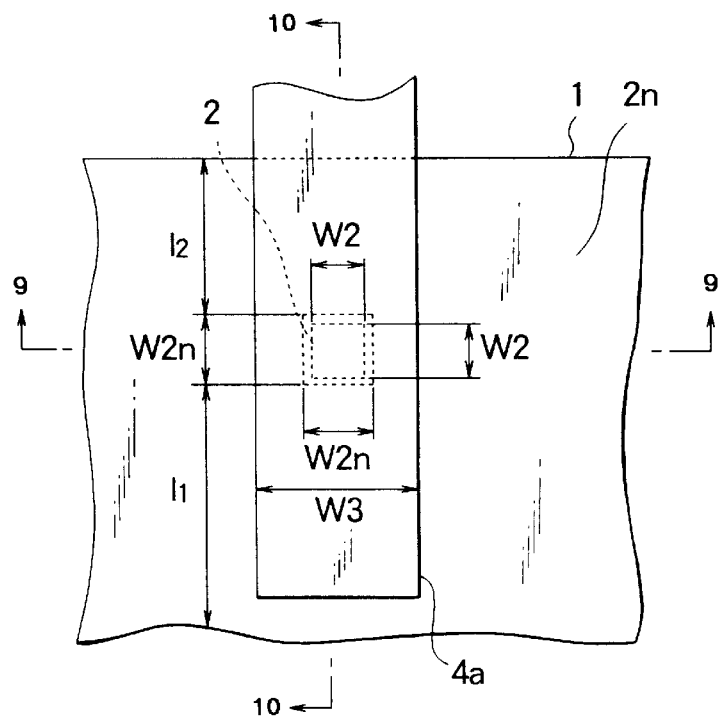
FIG. 8 is a plan view of a semiconductor chip for a detailed description of a joining state between an inner lead and an electrode according to this embodiment.

FIG. 8 is an plan view of the semiconductor chip 1 in the case that W3>W2 is set so that the Ffab/Fel from the following equation is 1 or more.

$$Ffab/Fel=1.27\times\{W3\times(l1+W2n+l2)-W2n\times W2n\}/\{W2\times W2\} \quad (5)$$

Figure 9:
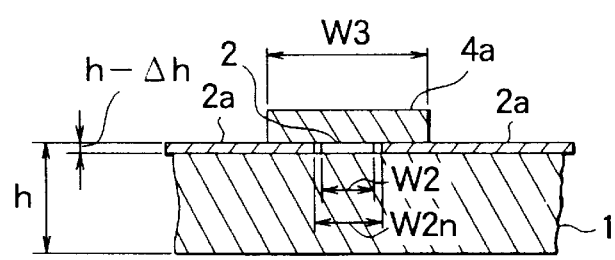
FIG. 9 is a cross-sectional view showing a cutting plane along line A—A in FIG. 8.
Figure 10:
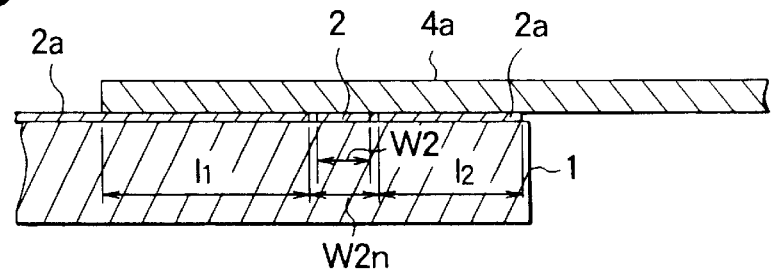
FIG. 10 is a cross-sectional view showing a cutting plane along line B—B in FIG. 8.

For increasing the value of Ffab/Fel, it is effective that W2 is set to be as small as possible and W3 is set to be as large as possible. FIG. 9 is a cross-sectional view taken along line A—A in FIG. 8 and FIG. 10 is a cross-sectional view taken along line B—B in FIG. 8. Although in FIGS. 8 to 10 the center of the inner lead 4a in the longitudinal direction is coincident with the junction center of the electrode 2 on the semiconductor chip 1 surface in the anode junctioning process, in the assembly process it is necessary to take the variations of the central line B—B and the central line A—A in to consideration. The dimension of each part is determined taking in to account the fact that the electrode 2 can not deviate from the anode junctioning range of the inner lead 4a even if such assembly errors take place, the electrode 2. In FIGS. 8 to 10, Ffab and Fel are obtained under the condition that the dimension of one side of the electrode 2 is taken as W2=50 $\mu$m, the dimension of one side of the opening section is taken to be W2n=51 $\mu$m, the thickness of the insulating coat 2a is h-$\Delta$h=25 $\mu$m, the width of the inner lead 4a is W3=300 $\mu$m, the dimension of one anode junctioning area is set to be l2=400 $\mu$m, and the dimension of the other anode functioning area is set to be l1=400 $\mu$m.

As a result, the anode junctioning force Ffab=1.01 kgf and the reaction force Fel due to the electrode compression equals Fel=7.88 gf. At this time, the surface pressure of the contact surface of the electrode 2 is 3.15 kgf/mm$^2$, which may be satisfactory in obtaining the electrical conduction. Moreover, this results in Ffab/Fel=128.2, thus making possible a sufficient functioning force. Although in FIG. 10 the anode junctioning section lengths l2 and l1 are different from each other and there is only one electrode 2, it is naturally possible to use a plurality of electrodes.

Figure 11:
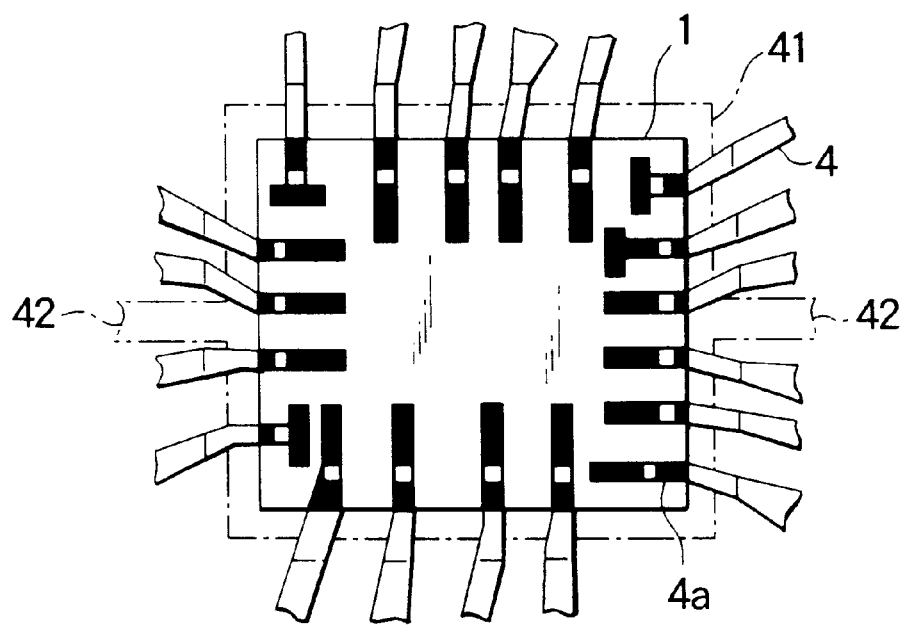
FIG. 11 is a plan view of a semiconductor chip, showing an anode-junctioned state of an inner lead onto the semiconductor chip according to this embodiment.
Figure 49:
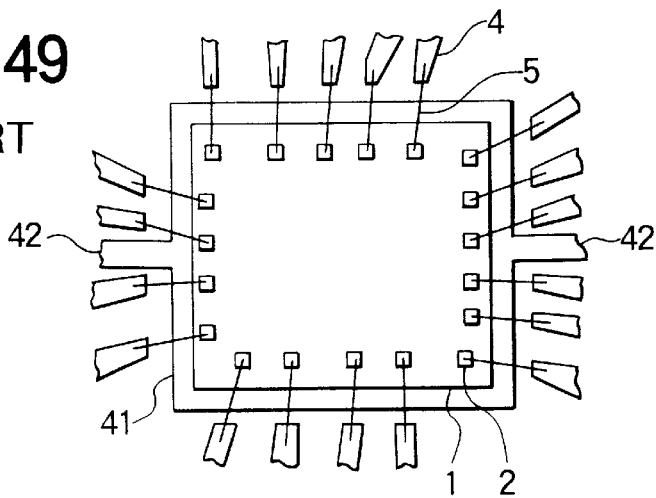
FIG. 49 is a plan view of a semiconductor chip, showing a joining state between an inner lead and electrode according to the wire bonding.
Figure 50:
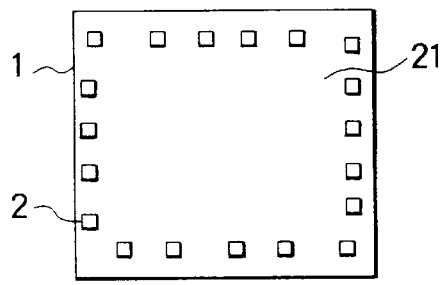
FIG. 50 is a plan view of a semiconductor chip, showing an arrangement state of electrodes on a semiconductor chip.

FIG. 11 is a plan view of a semiconductor chip viewed from the upper side, showing a state in which inner leads 4a and the semiconductor chip 1 are joined to each other according to the anode junction method. As is obvious from this illustration, the tip portion of the inner leads 4a extends to cross over the electrode 2 on the surface of the semiconductor chip 2. Further, the anode junction is made at the tip portion of the inner lead 4a painted out. In comparison with the junction between the inner lead 4 and the semiconductor chip 2 arising from the conventional wire bonding method as shown in FIG. 49, it is easily understood that the anode junction method according to this embodiment does not require the gold line 5, die pad 41 or suspended lead 42.

Figure 12:
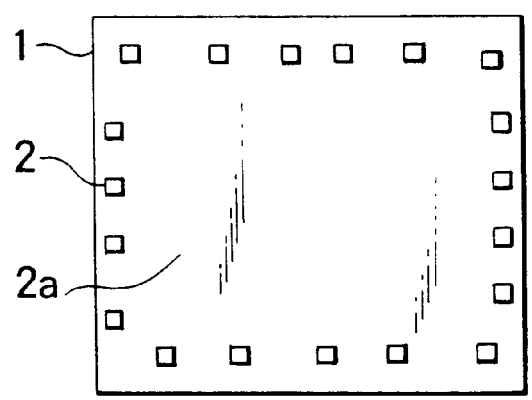
FIG. 12 is a plan view of a semiconductor chip, showing an arrangement of electrodes on the semiconductor chip according to this embodiment.

FIG. 12 illustrates the electrodes 2 placed on the semiconductor 1 surface and the insulating coat 2a in which opening sections are formed around the electrodes 2. It is to be noted that whole the surface of the semiconductor chip 1 onto which the insulating coat 2a is to adhered is an anode-junction allowable area, and it is possible to use even the anode-junction allowable area freely with no insulating coat 2a if required.

Second Embodiment

Although in the above-described first embodiment the contact surface of the electrode 2 with the inner lead 4a is formed to have a spheroidal or trapezoidal configuration, the configuration of the electrode 2 contact surface can take a pyramidal configuration or variable configurations made by using the side etch during formation by etching as log as the conditions described above are implemented offering the same effects. The only requirement is that the electrical contact area between the inner lead 4a and the electrode 2 will assume at least a necessary minimum value when the anode junction is completed. For example, as shown in FIG. 6B the contact portion of the electrode 2 to be crushed by the junction would deform to exceeding the plastic area as indicated by a dotted line, however, this is outputted as long as there is electrical conduction therebetween.

If the selection of the material of the electrode 2 is made properly, even if the electrode 2 is subjected to the plastic deformation, it is possible to normally maintain the electrical connection between the electrode 2 and the inner lead 4a. Even in the worst case a stable junction is obtainable as compared with the wire bonding method in which the gold line 5 is melted and the melted gold line 5 is re-joined with the aluminium electrode. The reason is that the mechanical junction between the inner lead 4a and portions other than the electrode 2 can be made with a sufficient strength because of the anode junction.

Third Embodiment

Although in the above-described first embodiment the contact surface of the electrode 2 is formed to have a spheroidal or trapezoidal configuration, in order to secure a large crushed amount $\Delta h$ between the insulating coat 2a and the electrode 2, it is effective to provide a conductive small ball (sphere) 2A made of gold, solder or the like which has a low elastic modulus is provided on the electrode 2 as shown in FIG. 7A. In the illustration, reference numeral 2B indicates a state in which the small ball 2A is crushed by an inner lead, not shown, in anode junction so that the inner lead and the electrode 2 are junctioned with each other to make a conductive state therebetween.

In FIG. 7A, the electrode 2 protrudes from the silicon substrate at the opening section of the insulating coat 2a, while in FIG. 7B the electrode 2 is exposed from the silicon substrate surface and positioned to be lower by (h−Δh) than the insulating coat 2a surface, with the result that a sphere 2C having a diameter greater than that of the conductive small ball 2A in FIG. 7A by a size corresponding to the thickness of the electrode 2a can be fitted in the opening section. Assuming that a configuration 2D of the crushed sphere 2C is a cylinder having a radius R and height (h−Δh), the relationship to the conductive ball σ can be expressed by the following equation.

$$R = \sqrt{\frac{4r^3}{3x(h-\Delta h)}} \quad (6)$$

If the radius r of the small sphere 2C is set to be equal to the thickness (h−Δh) of the insulating coat 2a, the radius R of the configuration 2D of the crushed small sphere 2C becomes R=1.155×r. That is, the fitted small sphere 2C having a radius r becomes larger by only 15.5% in radius when being crushed. Thus, the thickness (h−Δh) of the insulating coat 2a can be produced without improving manufacturing accuracy.

Furthermore, the dimension W2n of the electrode opening section of the insulating coat 2a need only to be larger than the radius R of the small sphere, and the variation in the radius R of the configuration 2D can be found on the basis of the radius r of the ball 2C and the thickness (h−Δh) of the insulating coat 2a. That is, $$(4/3) \pi r^3 = (h-\Delta h) \times \pi \times R^2 \quad (A)$$

differentiating both sides of equation (A), $$4 \pi r^2 \times \Delta r = 2\pi (h-\Delta h) R \times \Delta R + \pi \times R^2 \times \Delta(h-\Delta h) \quad (B)$$

thus, the following equation (C) can be given by taking the ratio of (B) and (A), $$\frac{1}{3} \times \Delta r/r = 2 \times \Delta R/R + \Delta(h-\Delta h)/(h-\Delta h) \quad (C)$$

from (C), $$\Delta R/R = \frac{1}{2} \times \{\frac{1}{3} \times \Delta r/r - \{\Delta(h-\Delta h)/(h-\Delta h)\}\} \quad (D)$$

The rate of change of the radius of a surface to be electrically joined can be expressed by the right side of (D) obtained by developing the equation (C). That is, when Δr/r=±10% and Δ(h−Δh)/(h−Δh)=±10%, ΔR/R is only changed by 6.7%, which allows an electrical connection with high accuracy. In other words, even if the manufacturing accuracy of the small sphere 2C and the insulating coat 2a are respectively 10%, the error in the radius of the portion to be used for the electrical connection after crushing is as small as 6.7%.

In the above equation (A), the volume of the small sphere is given as (4/3) π r³=V$_{Ball}$, and V$_{Ball}$/π×(h−Δh)=R². When the volume of the small sphere varies and the dimension (h−Δh) of the insulating coat includes an error, ΔR/R is expressed by the following equation.

$$\Delta R/R = \frac{1}{2}\pi \times \{\Delta V_{Ball}/V_{Ball} - \{\Delta(h-\Delta h)/(h-\Delta h)\}\} \quad (E)$$

Accordingly, even if the small sphere V$_{Ball}$ does not have a true spherical configuration, as long as it is a conductive inclusion with the necessary volume, this it may be a bump, laminated electrode, or conductive material protruding from the lead frame toward the electrode 2 according to this invention. The point is that a conductive material substituting for the small sphere V$_{Ball}$ be fitted in between the electrode 2 and the inner lead 4a. This can offer the same effect.

Although a description has been made with reference to FIGS. 6A to 7B in terms of an electrode 2 with ideal dimensions, when actually anode-junctioned, the reaction force Fel of the electrode 2 is large, and when the electrode 2 is not crushed Δh by means of the inner lead 4a, a non-junctioned portion can appear in the anode-junctioned area. However, when the area for the anode junction is sufficiently wide, even if the non-junctioned portion with the inner lead takes place near the electrode 2, the junctioned portion can maintain the mechanical strength between the inner lead 4a and the semiconductor chip 1. In this case, Δh can be set in an ordinary way without taking the accuracy of Δh into consideration.

Fourth Embodiment

Although the conductive inclusion for the electrode section has been described above as being a small sphere 2A or 2C having a completely spherical configuration as illustrated in FIGS. 7A and 7B, if the condition mentioned in the third embodiment is satisfied, an irregularly configured body such as a rectangular parallelepiped and cube can produce the same effect. Further, the material of the irregularly configured body can be an easily stretchable material such as aluminium, solder and gold or a liquid conductive material such as mercury, and a conductive resin. However, when the material of the semiconductor chip is silicon or GaAs, the semiconductor chip will be broken if the conductive inclusion is made of a material having an elastic modulus higher than that of such materials, for which reason it is preferable that the conductive inclusion be made of a material having an elastic modulus lower than that of the material of the semiconductor chip. In addition, it is also possible to use a conductive resin or the like other than a metal. In this case, it is undesirable to use a material which, when crushed, is stretched so that its dimension exceeds the dimension W2n of the opening section in the insulating coat 2a.

Figure 13:
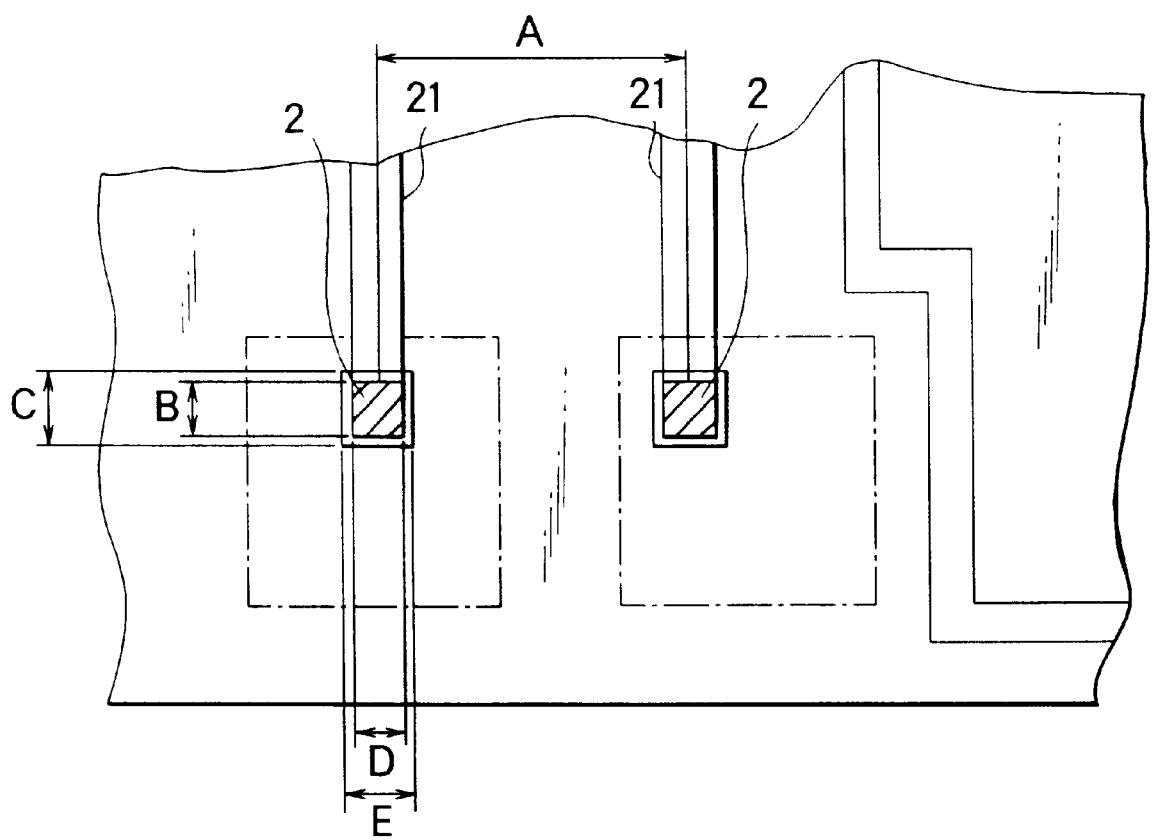
FIG. 13 is a partially enlarged view of a semiconductor chip for a detailed description of an electrode joining portion in FIG. 11.
Figure 51:
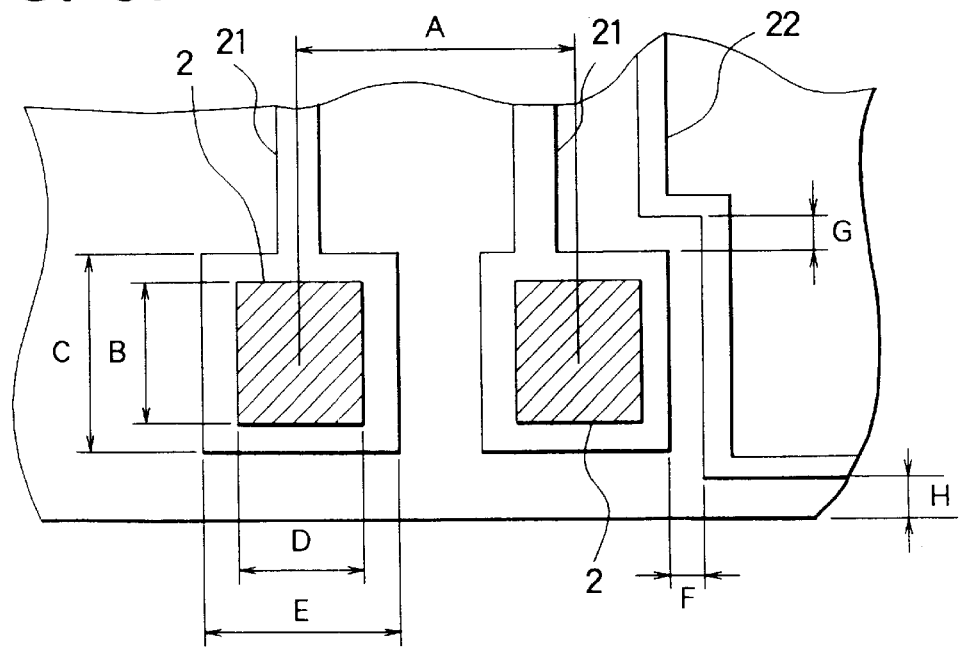
FIG. 51 is a plan view of a semiconductor chip, showing arrangement and dimensions of electrodes on a semiconductor chip.
Figure 52:
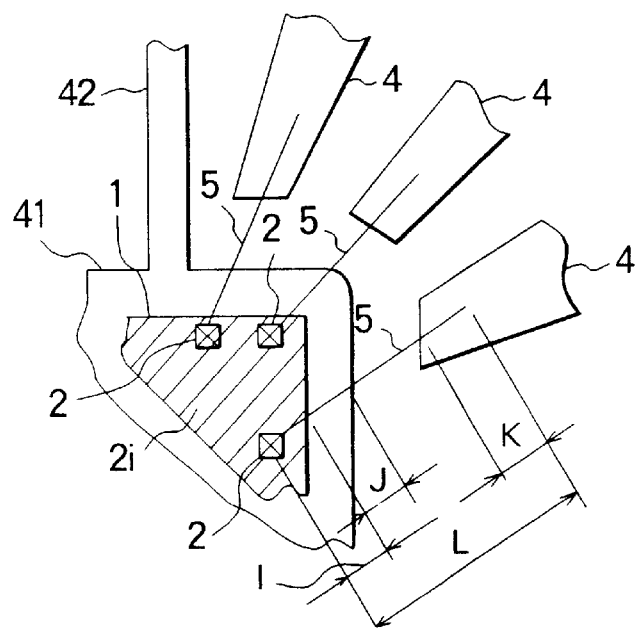
FIG. 52 is a plan view showing relative dimensions among an electrode, gold line and inner lead.
Figure 53:
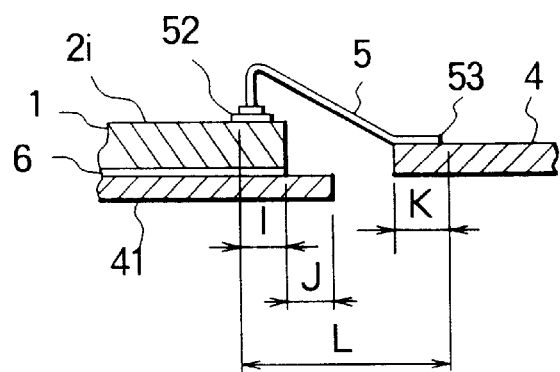
FIG. 53 is a side elevational view showing a gold line portion in FIG. 52.

FIG. 13 is a partially enlarged view of the semiconductor chip 1 surface for describing the fact that, when the junction method according to this embodiment is employed, the pitch of the adjacent electrodes 2, which has been determined depending upon the dimensions of the electrode 2, can be made smaller to allow the chip to be made small. The description will be made in terms of the dimension A between wiring conductors 21 in FIG. 13 and the dimension A in FIG. 51 resulting from the conventional junction method. In FIG. 51, the pitch A of the electrodes 2 depends upon the dimension D of the electrode 2 and the dimension E of the opening section. On the other hand, if the inner lead 4a and the semiconductor chip 1 are joined with each other according to the anode junction of this embodiment, the dimensions B and D of the electrode 2 and the dimensions C and E of the opening section indicated in FIG. 13 can be made smaller. This results from the fact that the dimension A between the inner leads 4a can be reduced extremely. Since reducing the dimensions B and D is possible, the electrode 2 requires only a minimum area for permitting the electrical junction, and there is no need for a large area to be insured in order to enhance the mechanical junction with the inner lead 4a.

The relationship between the area of the electrodes 2 and the anode junctioning area of all the inner leads will be described hereinbelow with reference to FIGS. 13, 8 and 12. In FIG. 12, the area of the insulating coat 2a to be anode-junctioned on the semiconductor chip is {W3×(l1+W2n+l2)−W2n×W2n} when using dimensions l1, l2, W3, W2n and W2 shown in FIG. 8. The number of anode junctioning portions is 19 corresponding to the number (19) of the electrodes 2, and hence the total area of the insulating coat 2a to be anode-junctioned is 19×{W3×(l1+W2n+l2)−W2n×W2n}. The area of each of the electrodes 2 is 19×W2n×W2n, and if the area of the electrode 2 is reduced, the area of the anode junctioning area becomes larger, and the mechanical junctioning force Ffab also becomes larger. The dimension W2n determining the area of the electrode 2 is equivalent to the dimension D shown in FIG. 13, and therefore, as the dimension becomes smaller, the dimension A can be reduced. Accordingly, reducing the dimension W2n or D is the most important factor to reduce the size of the semiconductor chip and to achieve the purpose of enhancing the mechanical junctioning force Ffab.

Fifth Embodiment

Figure 14A:
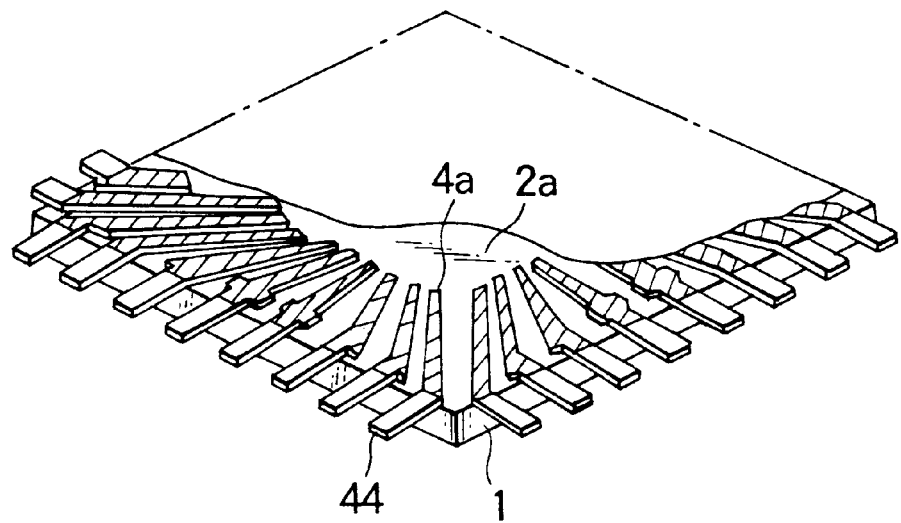
FIGS. 14A and 14B are perspective views showing QFP type and SOP type semiconductor devices in which an electrode and inner lead are joined with each other according to an anode junction method.
Figure 14B:
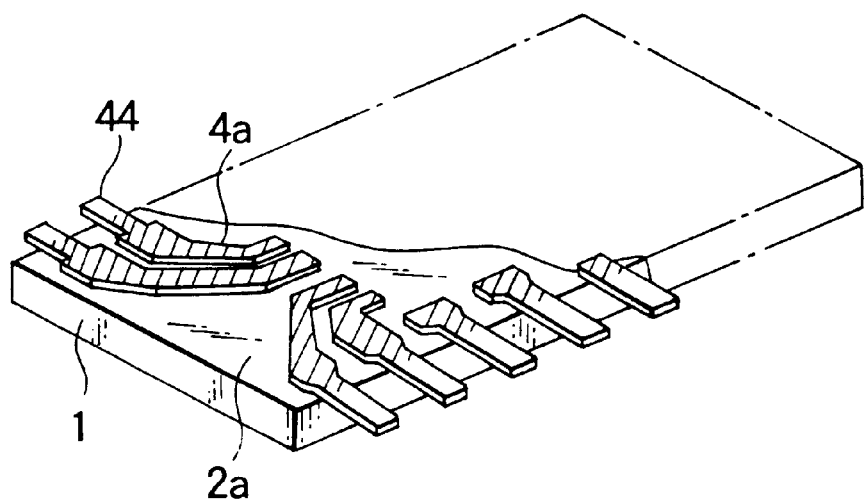

FIG. 14A illustrates a semiconductor device constructed without using a molding resin, and shows a moldless QFP package. Similarly, FIG. 14B illustrates a semiconductor device constructed with no molding resin, and shows a moldless QFP package. In these illustrations, broken lines indicate a range molded if required to protect the semiconductor chip 1 against the external environment. With the semiconductor device being manufactured using the anode junction method, the inner lead 4a can be directly joined with the surface of the semiconductor chip 1 and fixed thereonto and the tip portion of the inner lead 4a can be pressed against the electrode to make an electrical junction therebetween, and hence unlike the semiconductor device manufactured using the conventional wire bonding method, a molding resin is unnecessary for protecting the gold line 5 portion and for fixing the inner lead 4. In addition, since external leads 44 can be directly bent downwardly at the edge portion of the semiconductor chip 1, the configuration of the semiconductor device can be reduced by the size corresponding to the unnecessary molding resin.

Figure 15A:
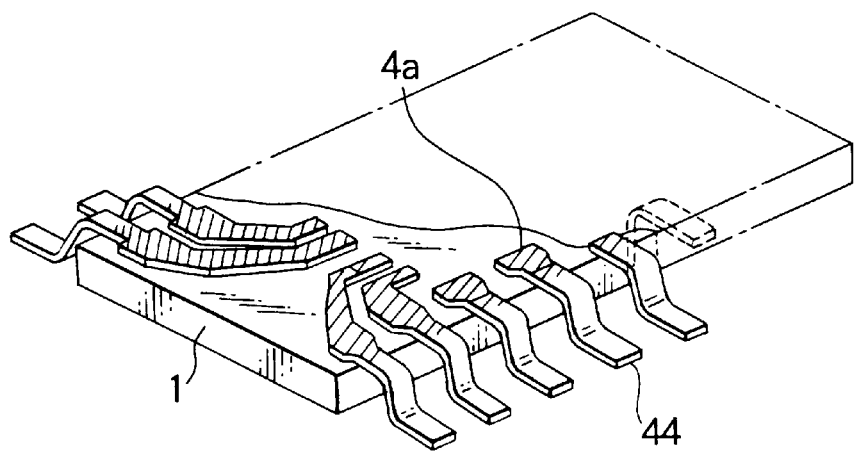
FIGS. 15A and 15B are perspective views showing another type semiconductor device manufactured with an electrode and inner lead being joined with each other according to an anode junction method.
Figure 15B:
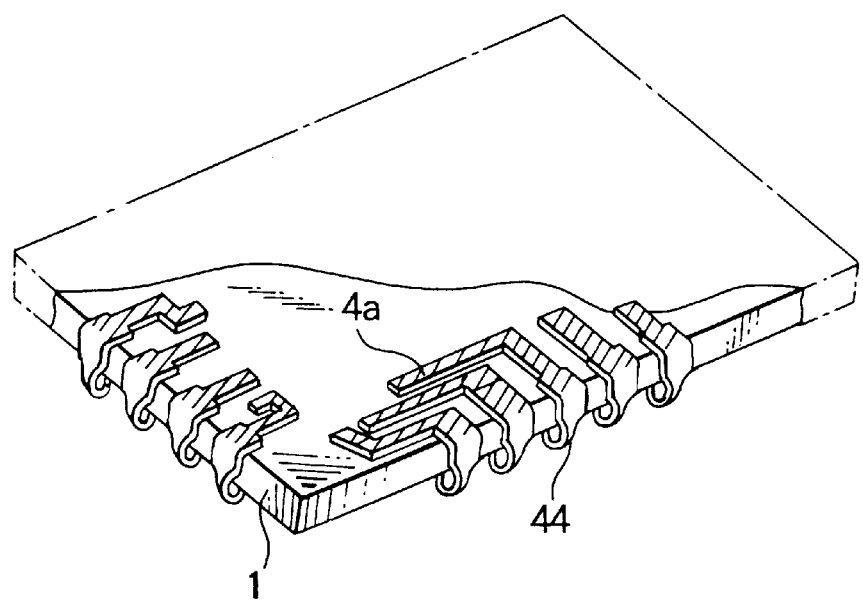

FIG. 15A shows a moldless SOP (Small Outline Package) TYPE I. In FIG. 15A, external leads 44 are configured to have a gull-wing shape so that a semiconductor chip 1 is mounted on a substrate in a face-up state, while it is also appropriate that the external leads 44 be bent upwardly as indicated by dotted lines to take another gull-wing shape so that the semiconductor chip 1 is mounted thereon in the face-down position. FIG. 15B illustrates a moldless J-bent leads 44, where the external leads 44 is bent downwardly along the edge of the semiconductor chip 1. In the same illustration, it is also possible that the J-bent external leads 44 be bent in the opposite direction like the gull-wing configuration.

Figure 16A:
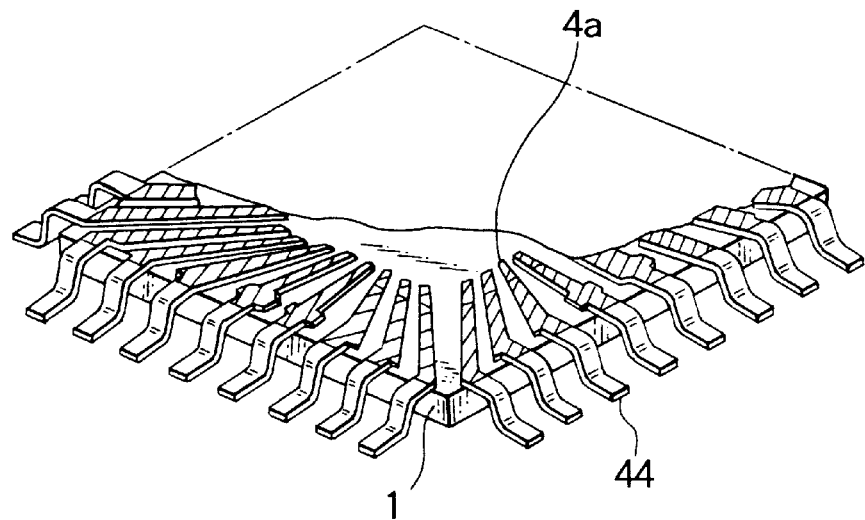
FIGS. 16A and 16B are perspective views showing a modification of a QFP type semiconductor device manufactured with an electrode and inner lead being joined with each other according to an anode junction method.
Figure 16B:
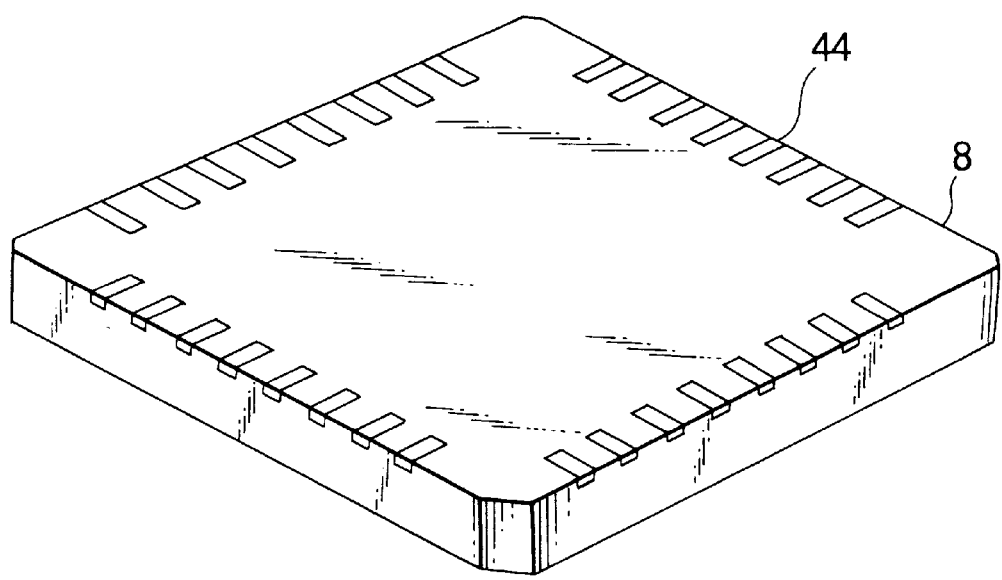

FIG. 16A illustrates a moldless QFP package having gull-wing external leads 44, the QFP package being mounted in a face-up position. Although omitted in the illustration, SIP (Single Inline Package) and DIP (Dual Inline Package) are applicable to all the conventional packages. FIG. 16B shows a state of molding with a molding resin 8 up to the tip portion of the external leads 44 shown in FIG. 16A. The outer packing by the molding resin 8 improves the degree of flatness of the external leads 44.

Figure 17:
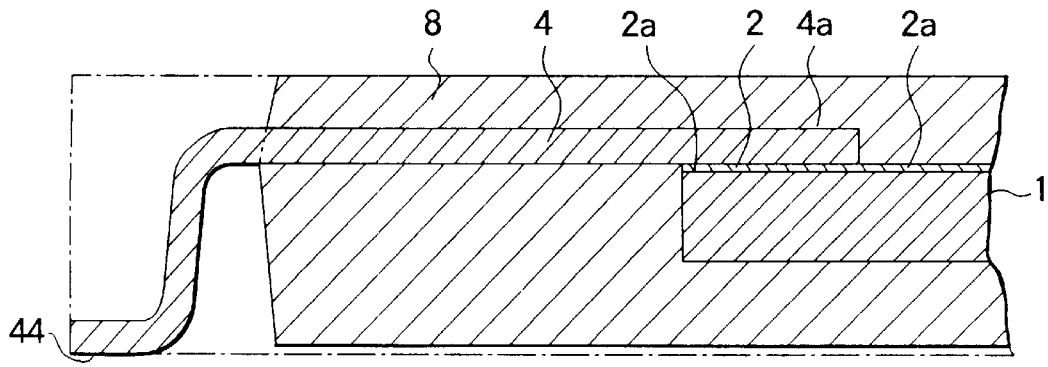
FIG. 17 is an enlarged cross-sectional view of a semiconductor device, showing a joining portion between an electrode and inner lead of the semiconductor device manufactured according to an anode junction method.
Figure 43:
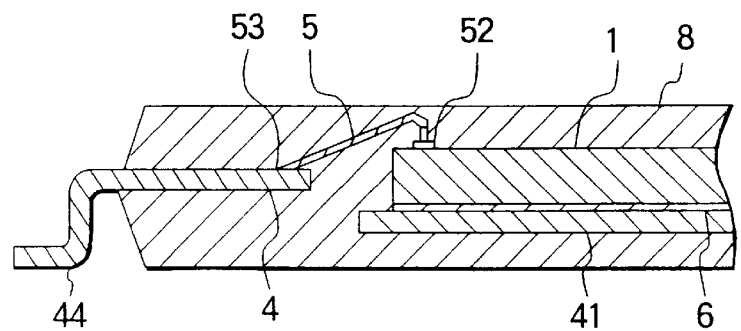
FIG. 43 is a cross-sectional view showing a portion of a semiconductor device manufactured according to the wire bonding.
Figure 44:
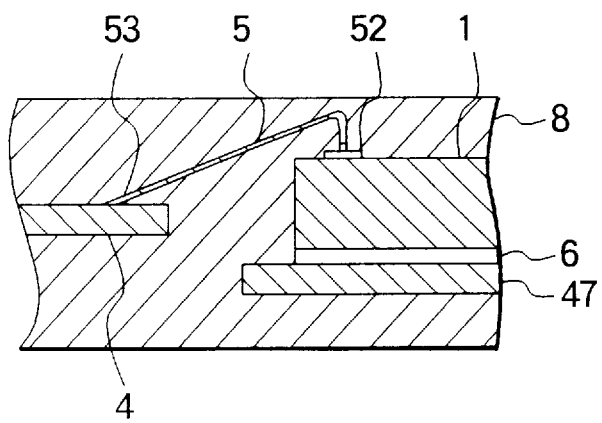
FIG. 44 is an enlarged cross-sectional view showing a wire bonding portion in FIG. 43.
Figure 45:
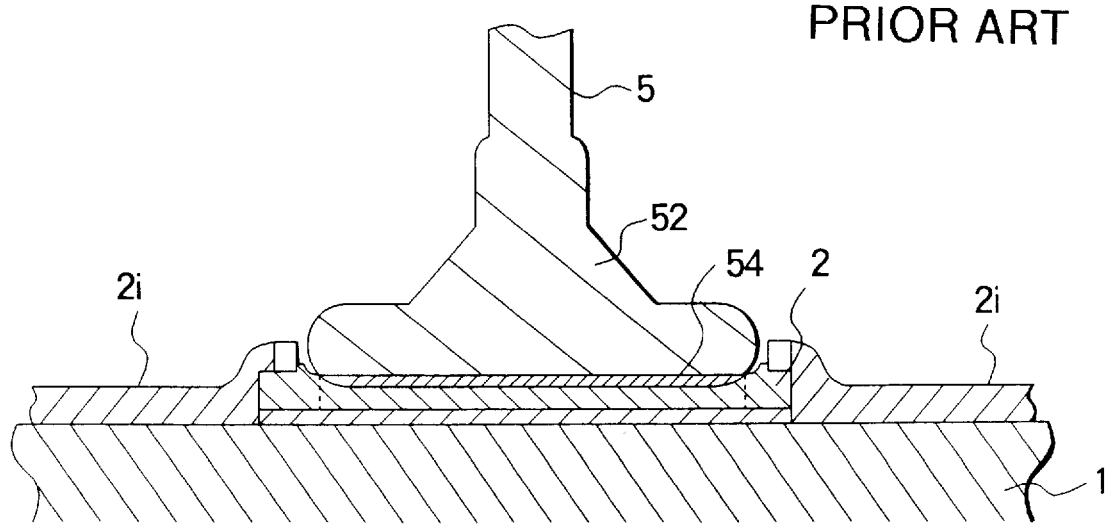
FIG. 45 is a cross-sectional view for describing a joining state of a gold ball to an electrode.
Figure 46:
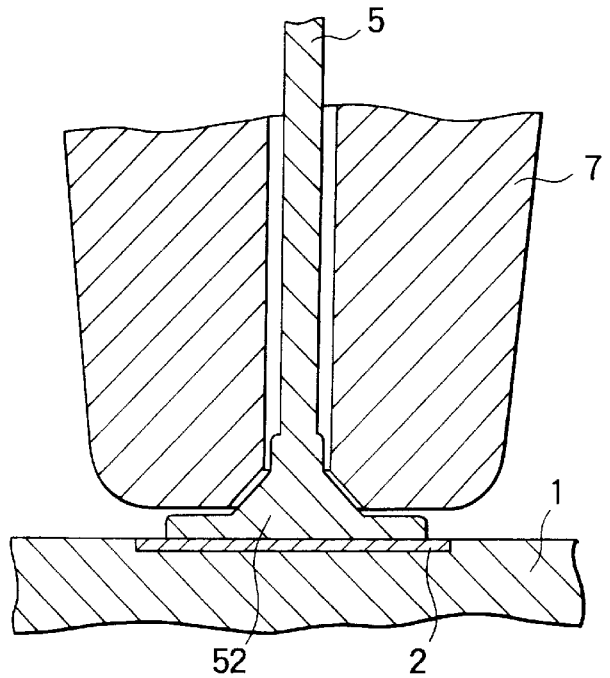
FIG. 46 is a cross-sectional view for describing a wire bonding state of a gold line.
Figure 47:
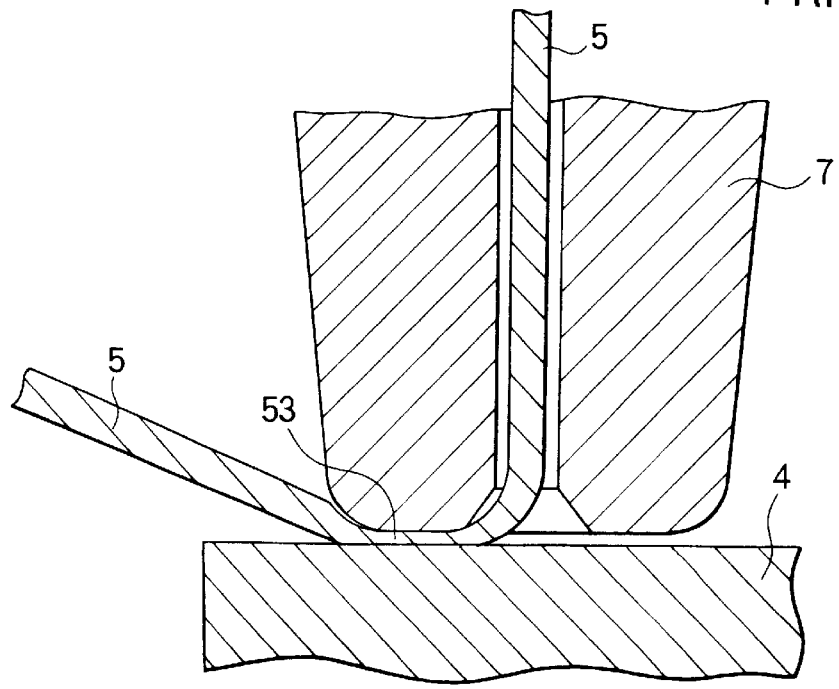
FIG. 47 is a cross-sectional view for describing a stitch bonding state of a gold line.
Figure 48A:
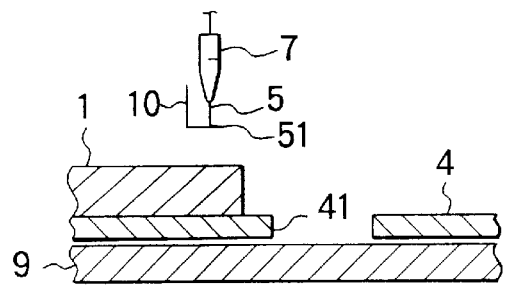
FIGS. 48A to 48E are cross-sectional views of a semiconductor device for describing wire bonding processes.
Figure 48B:
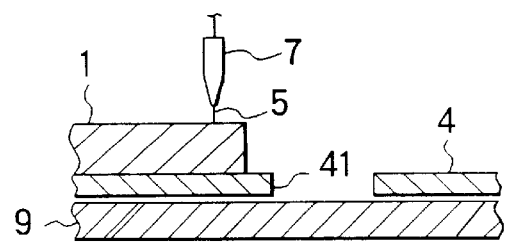
Figure 48C:
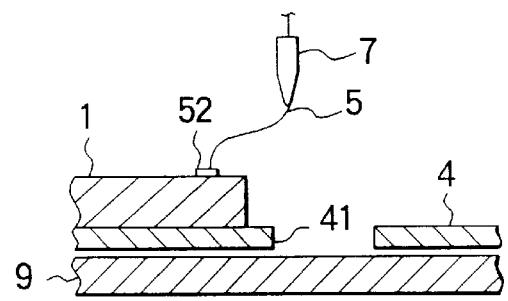
Figure 48D:
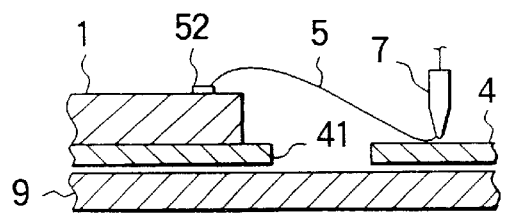
Figure 48E:
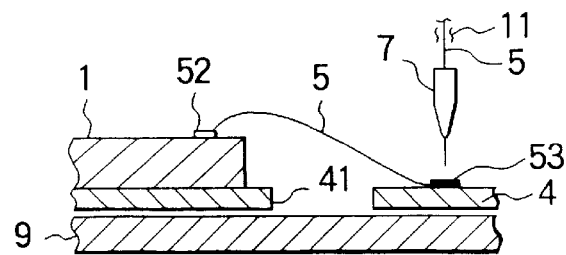

FIG. 17 illustrates one example in which the anode junction method according to this embodiment is applied to a semiconductor device. Compared with the semiconductor device manufactured by the conventional junction method as shown in FIG. 43, it can be understood from FIG. 17 that the gold line 5, die pad 41 and die bonding material 6 are unnecessary. Further, it is possible that the semiconductor device be packed with a molding resin 8 up to the position indicated by the broken line.

Figure 18:
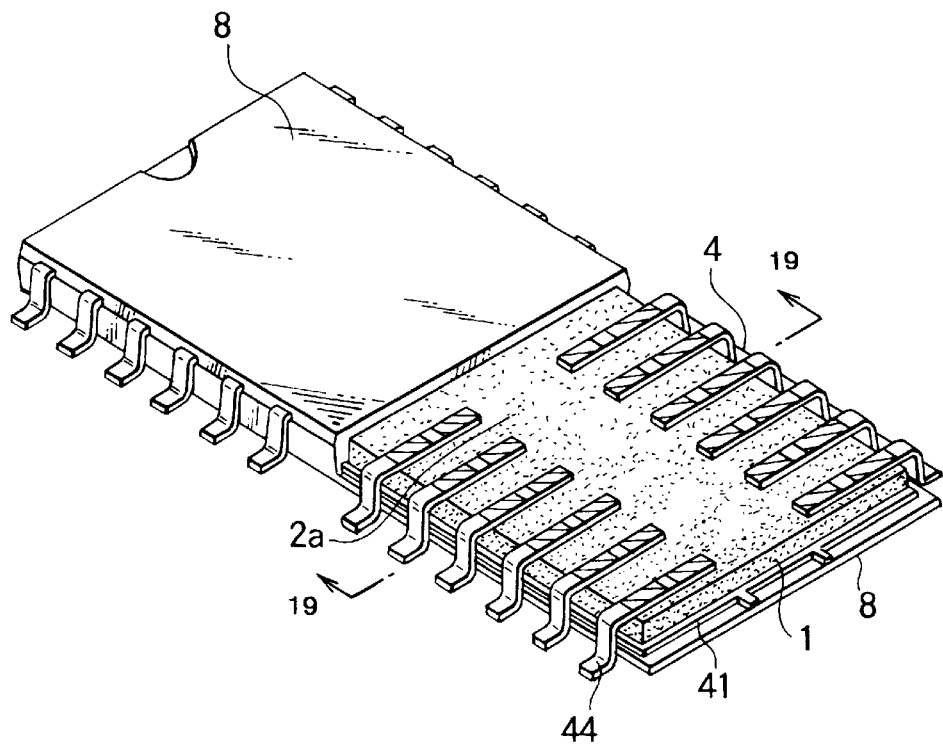
FIG. 18 is a perspective view of a semiconductor device, showing an internal structure of the semiconductor device manufactured according to an anode junction method.
Figure 19:
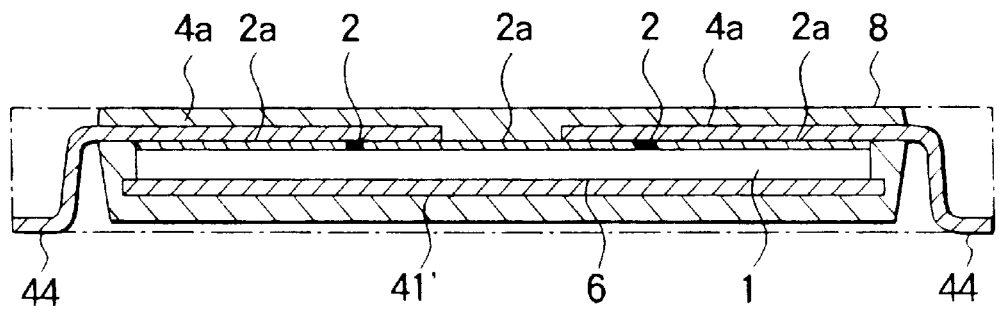
FIG. 19 is a cross-sectional view of a semiconductor device, showing a cutting plane along line Z—Z in FIG. 18.
Figure 54A:
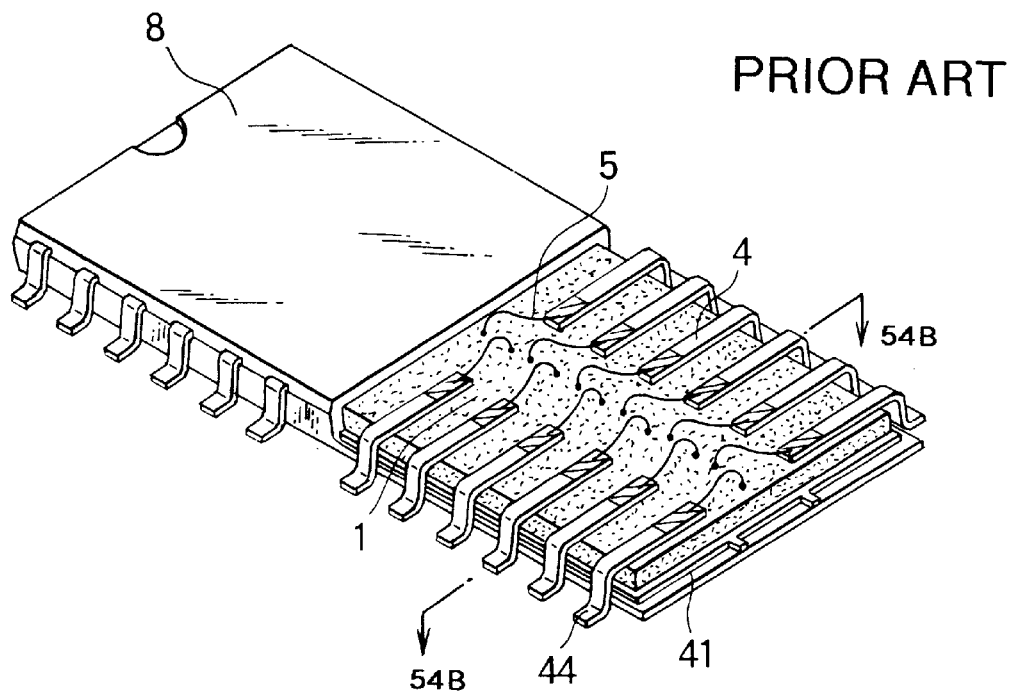
FIGS. 54A and 54B are a perspective view and cross-sectional view showing a semiconductor device manufactured using the wire bonding.
Figure 54B:
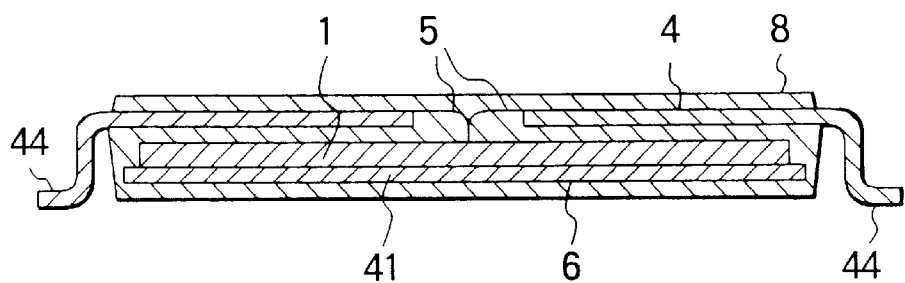

FIG. 18 shows an LOC (Lead On Chip) type based on the anode junction method according to this invention. FIG. 19 is a cross-sectional view taken along line Z—Z in FIG. 18 for easy understanding of the anode-junctioned portion. As is obvious by referring to FIGS. 54A and 54B showing a conventional LOC type, in contrast to the case where the electrode 2 and the inner lead 4 are connected to each other through the gold line 5, the inner lead 4a is directly connected to the electrode 2, thus providing an LOC type semiconductor device with high reliability. It is also possible that the semiconductor device be packed with a molding resin 8 up to the position indicated by the broken line in FIG. 19.

Figure 20:
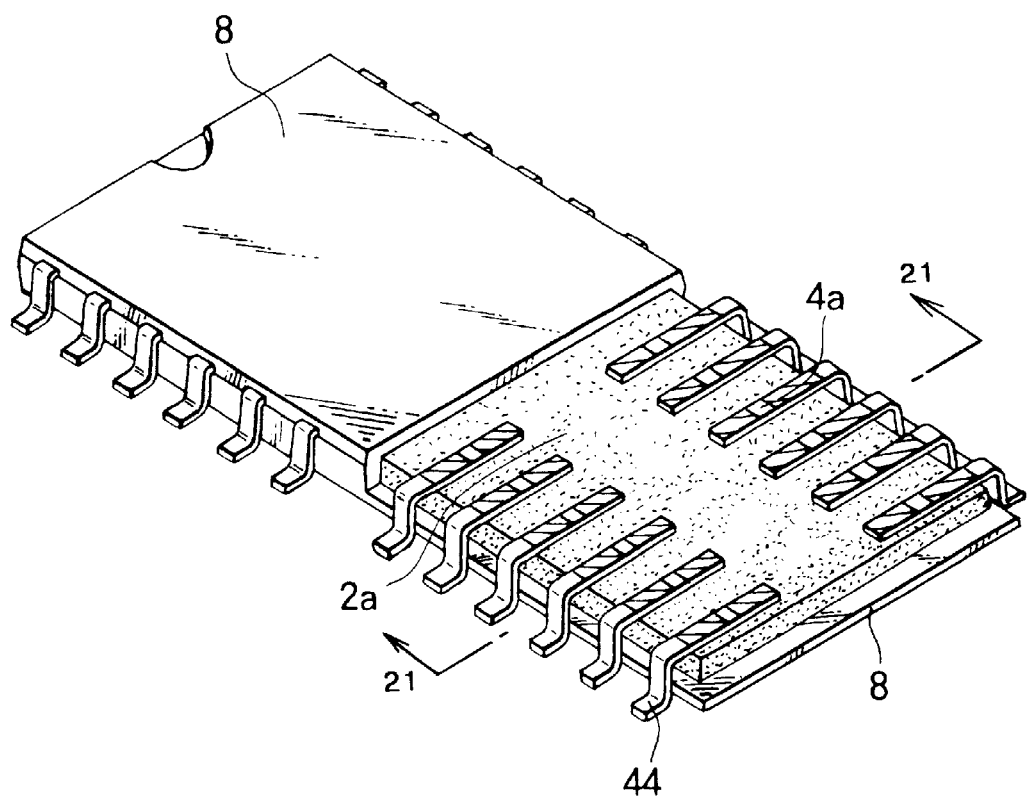
FIG. 20 is a perspective view of a semiconductor device, showing an internal structure of the semiconductor device not requiring a die pad due to an anode junction method.
Figure 21:
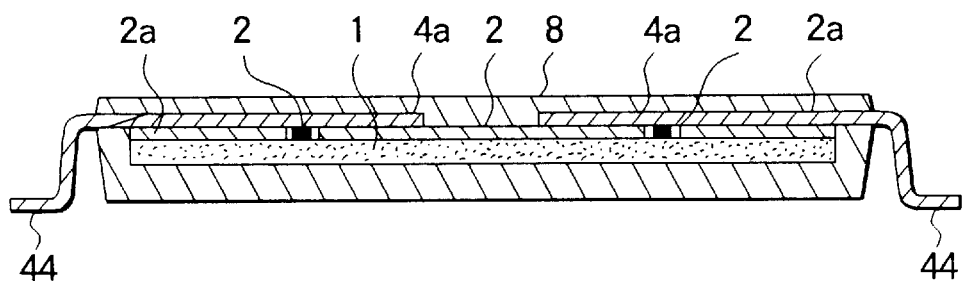
FIG. 21 is a cross-sectional view of a semiconductor device, showing a cutting plane along line W—W in FIG. 20.

FIG. 20 shows one example in which, when the anode junction method is used, an LOC package is obtainable with no die pad 41. FIG. 21 is a cross-sectional view taken along line W—W in FIG. 20 for better understanding of the anode-junctioned portion. As is obvious from these illustrations, the inner lead directly joined with the semiconductor chip 1 is fixed with a molding resin 8, whereby a die pad 41 supporting the semiconductor chip 1 can be omitted.

Figure 22:
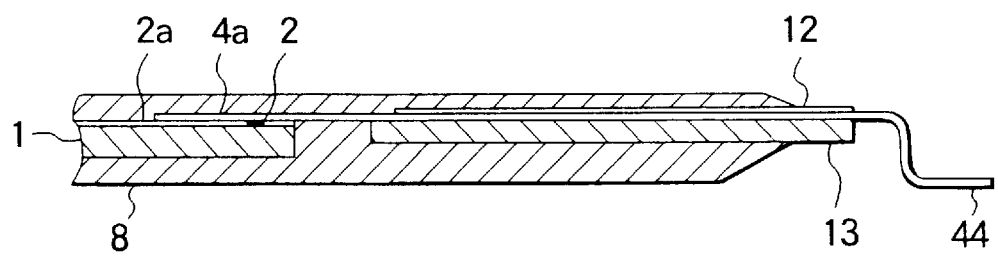
FIG. 22 is a cross-sectional view showing a semiconductor device manufactured using an anode junction method in accordance with the TAB technique.
Figure 23:
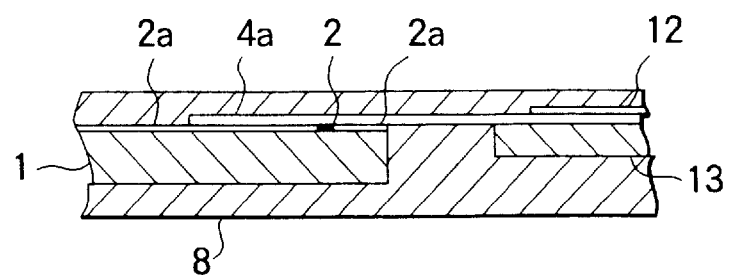
FIG. 23 is an enlarged cross-sectional view of a semiconductor device, showing an anode-junctioned portion in FIG. 22.
Figure 24:
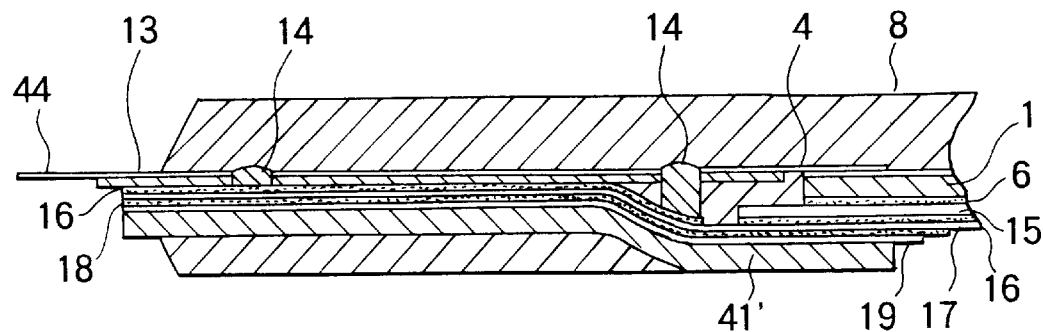
FIG. 24 is a cross-sectional view showing a large-output semiconductor device manufactured using an anode junction method.
Figure 25:
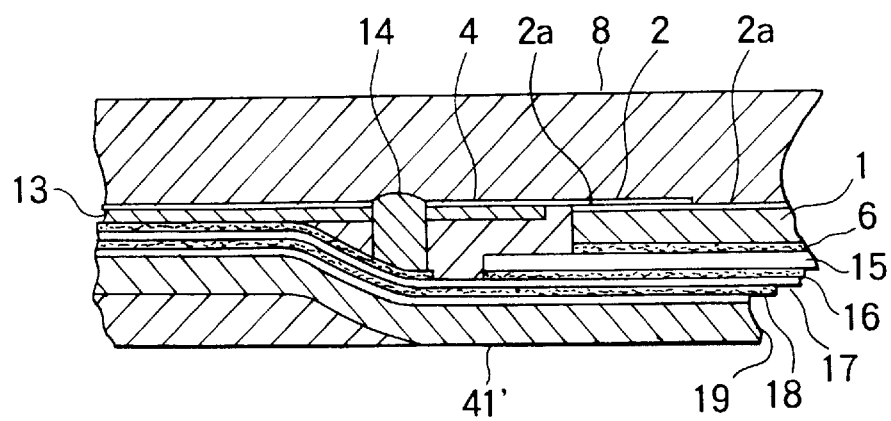
FIG. 25 is an enlarged cross-sectional view of a semiconductor device, showing an anode-junctioned portion in FIG. 24.
Figure 55A:
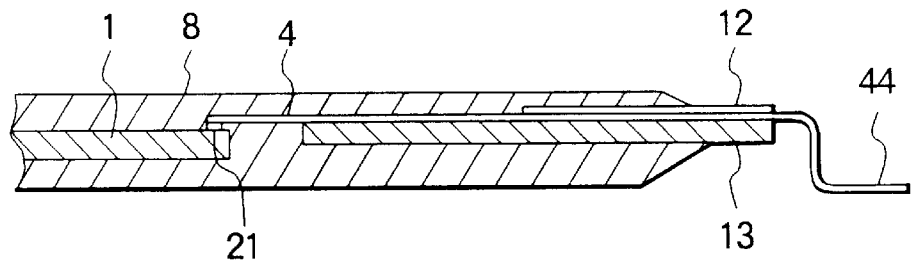
FIGS. 55A and 55B are a cross-sectional view of a semiconductor device manufactured according to the TAB technique and an enlarged cross-sectional view of a wire bonding portion.
Figure 55B:
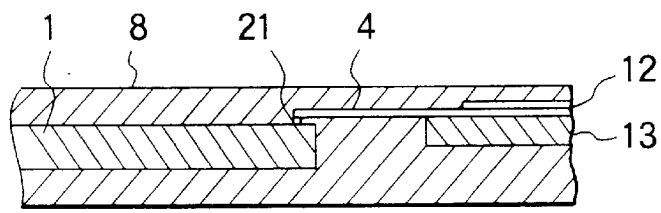

FIG. 22 shows one example of a TAB package manufactured using the anode junction. Compared with the conventional TAB package as shown in FIGS. 55A and 55B, it is possible to make a stronger junction between the lead and the chip. FIG. 23 is an enlarged view showing the junctioned portion in detail. FIG. 24 illustrates one example of a large-output IC manufactured using the anode junction. FIG. 25 is an enlarged view of a junctioned portion. In FIG. 25, numeral 41' designates a heat sinking plate.

Sixth Embodiment

Figure 26:
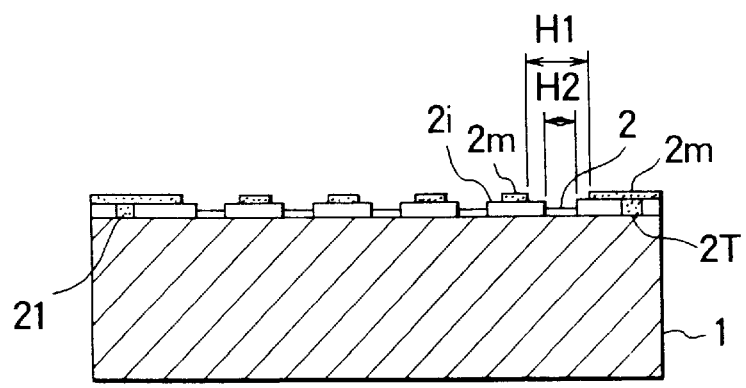
FIG. 26 is a cross-sectional view showing a semiconductor chip according to another embodiment.

Although in the above-described embodiments the anode junction is made in the condition in which the lead frame 4 is used as the anode and the semiconductor chip 1 is used as the cathode, a description will be made in terms of the case where the anode junction is carried out under the conditions in which the lead frame 4 is used as the cathode and the semiconductor chip is used as the anode. In a case where the semiconductor chip is used as the anode, as shown in FIG. 26 through-holes 2T reaching a silicon substrate are formed in a passivation insulating film adhered onto the semiconductor chip 1, the through-holes 2T being placed at end portions other than electrodes 2 on the semiconductor chip 1. After the through-holes 2T are formed, a metallic coat 2m is adhered onto a passivation insulating film 2i. As a result, the metallic coat 2m is accumulated in the through-holes 2T, thereby making the conduction between the silicon substrate and the metallic coat 2m. After the metallic coat 2m is thus adhered thereonto, square opening sections with dimensions on one side of H1 are provided relative to the metallic film 2m around the positions at which the electrodes 2 exist, with the result that the passivation insulating film 2i is exposed.

Secondly, square opening sections each having one side of H2 are provided around the positions of the electrode 2 relative to the exposed passivation insulating film 2i, so that the electrodes 2 are exposed. The dimension H2 of the opening section is determined in correspondence with the one side dimension of a quadrangle electrode projecting portions provided at the tip portions of the inner leads 4a. On the other hand, the dimension H1 is determined in correspondence with the crushed width in the case that the electrode projecting portion is pressed by the electrode 2 to be plastic-deformed.

A description will next be made with reference to FIG. 27 in terms of a method of forming a lead frame 4 in the case that the anode junction is performed when the lead frame 4 is used as the cathode. In the same illustration, square electrode projecting portions 2P each having one side of P are provided at the tip portions of the inner leads 4a, i.e., the anode junctioning areas, and at the positions of the electrodes 2 on the semiconductor chip 1. In addition, an insulating coat 2a is adhered onto the anode junctioning area other than the electrode projecting portion 2P.

Figure 27:
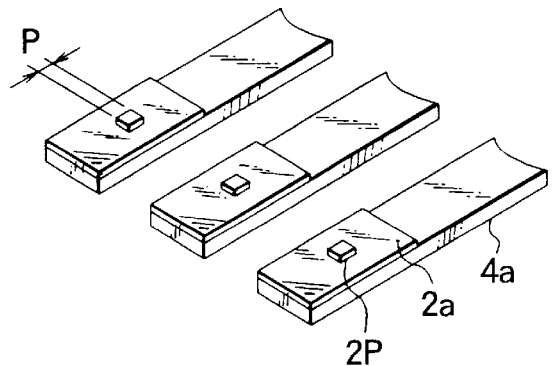
FIG. 27 is a perspective view showing a tip configuration of inner leads to be anode-junctioned with a semiconductor chip in FIG. 26.
Figure 28:
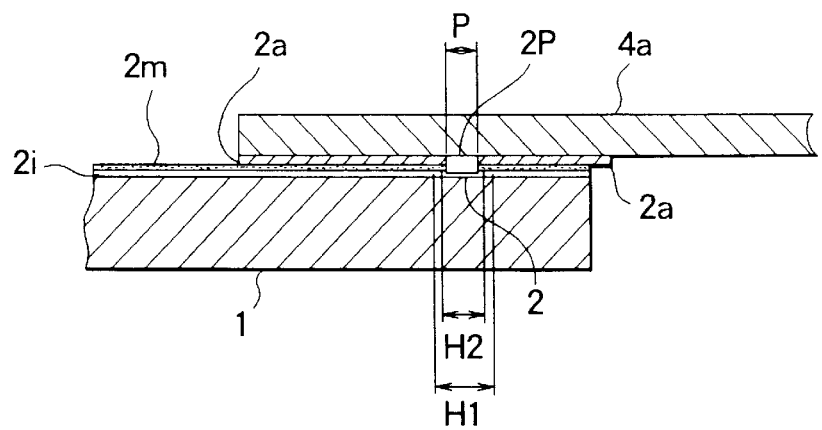
FIG. 28 is a cross-sectional view of a semiconductor chip, showing a state in which the inner lead in FIG. 27 is anode-junctioned with the semiconductor chip in FIG. 26.

FIG. 28 is a cross-sectional view showing a state in which the anode junction is completed with the semiconductor chip as shown in FIG. 26 being used as the anode and the inner lead 4a shown in FIG. 27 being used as the cathode. In the illustration, the total dimensions of the thickness of the insulating coat 2a provided on the inner lead 4a, the thickness of the passivation insulating film 2i provided on the surface of the semiconductor chip 1 and the thickness of the metallic film 2m is made to be smaller by $\Delta h$ than the total dimension of the thickness of the electrode projecting portion 2P provided on the lead frame 4 and the thickness of the electrode 2 provided on the semiconductor chip 1. When the inner lead 4a is anode-junctioned with the semiconductor chip 1, the electrode projecting portion 2P is compressed by $\Delta h$ relative to the electrode 2 and joined therewith.

Seventh Embodiment

Although in the above-described sixth embodiment the electrode projecting portion 2P provided in the anode junctioning area of the inner lead 4a is brought into pressure contact with the electrode 2 exposed in the bottom surface of the opening section on the semiconductor chip 1, it is also appropriate that the electrode 2 is made to protrude and the protruded electrode 2 is brought into pressure contact with the anode junctioning area of the inner lead 4a.

Figure 29:
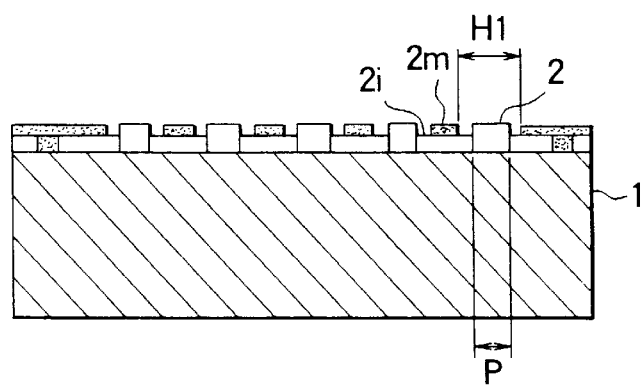
FIG. 29 is a cross-sectional view showing a semiconductor chip according to a further embodiment.

FIG. 29 is a cross-sectional view of a semiconductor chip 1, showing an arrangement in which the top surface of each square electrode 2 whose one side dimension is P is made to protrude relative to the uppermost surface of a metallic coat 2m adhered onto a passivation insulating film 2i of the semiconductor chip 1, and an opening section whose one side dimension is H1 is formed around the electrode 2 in the passivation insulating film 2i.

Figure 30:
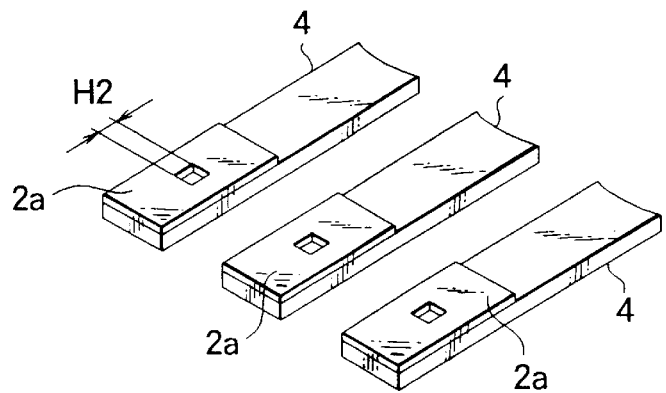
FIG. 30 is a perspective view showing a tip configuration of an inner lead anode-junctioned with the semiconductor chip in FIG. 29.

FIG. 30 is a perspective view showing a structure of an inner lead 4a, an insulating coat 2a which has a conductive property when being heated that is adhered onto the anode junctioning area of the inner lead 4a, and an opening section being a depression having a dimension of H2 that is made at the position to be joined with the electrode 2 on the insulating coat 2a for conduction. A surface of a lead frame 4 appears at the bottom of the opening section.

Figure 31:
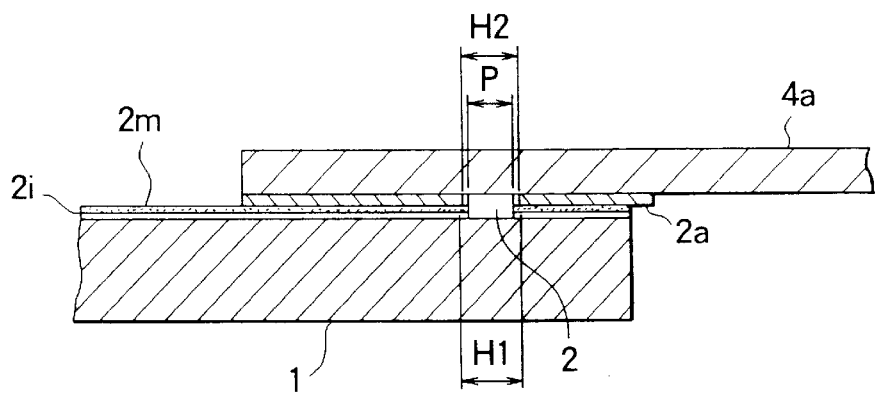
FIG. 31 is a cross-sectional view showing a state in which the inner lead in FIG. 30 is anode-junctioned with the semiconductor chip in FIG. 29.

FIG. 31 is a cross-sectional view showing a state in which the anode junction is completed with the semiconductor chip 1 shown in FIG. 29 being used as the anode and the inner lead 4a shown in FIG. 30 being used as the cathode. In the illustration, the total dimension of the thickness of an insulating coat 2a, the thickness of a passivation insulating film 2i and the thickness of a metallic film 2m is made to be smaller by $\Delta h$ than the thickness of an electrode 2. As a result, when the inner lead 4a is anode-junctioned with the semiconductor chip 1, an electrode projecting portion 2P and electrode 2 are compressed and deformed by $\Delta h$ to make the electrical connection.

Eighth Embodiment

Although in the above-described seventh embodiment the inner lead 4a and the semiconductor chip 1 are anode-junctioned with each other so that the inner lead 4a is brought into contact with the electrode on the semiconductor chip 1 under pressure for the electrical junction, it is also possible that a plurality of semiconductor chips 1 are simultaneously mounted on the wiring insulating substrate with the semiconductor chips 1 and a wiring insulating substrate being anode-junctioned with each other.

Figure 32:
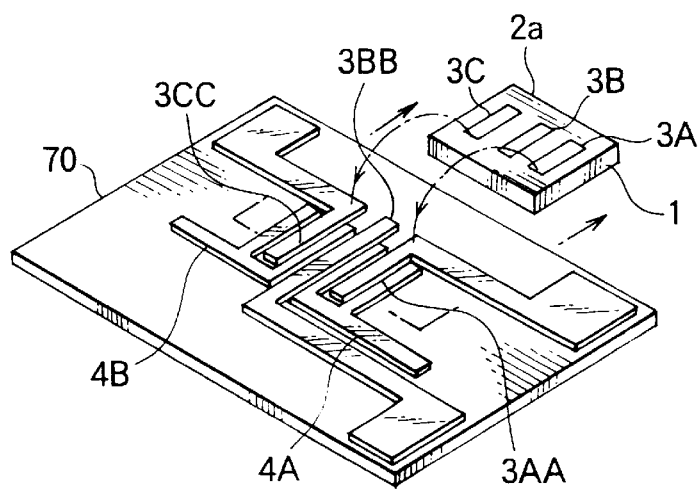
FIG. 32 is a perspective view showing a state in which a semiconductor chip is mounted on a wiring substrate according to an anode junction method.

FIG. 32 is a perspective view for describing a method of anode-junctioning a semiconductor chip onto a wiring insulating substrate. In the illustration, surfaces of electrodes 3A to 3C separately disposed on the semiconductor chip 1 protrude by $\Delta h$ from the surface of the insulating coat 2a. On a wiring insulating substrate 70 there are patterned conductive wiring 3AA to 3CC brought into pressure contact with the electrodes 3A to 3C on the semiconductor chip 1, and anode junctioning conductive pieces 4A, 4B made of the same material (copper foil plate) as a conductive wiring to be anode-junctioned with the insulating coat 2a.

Figure 33:
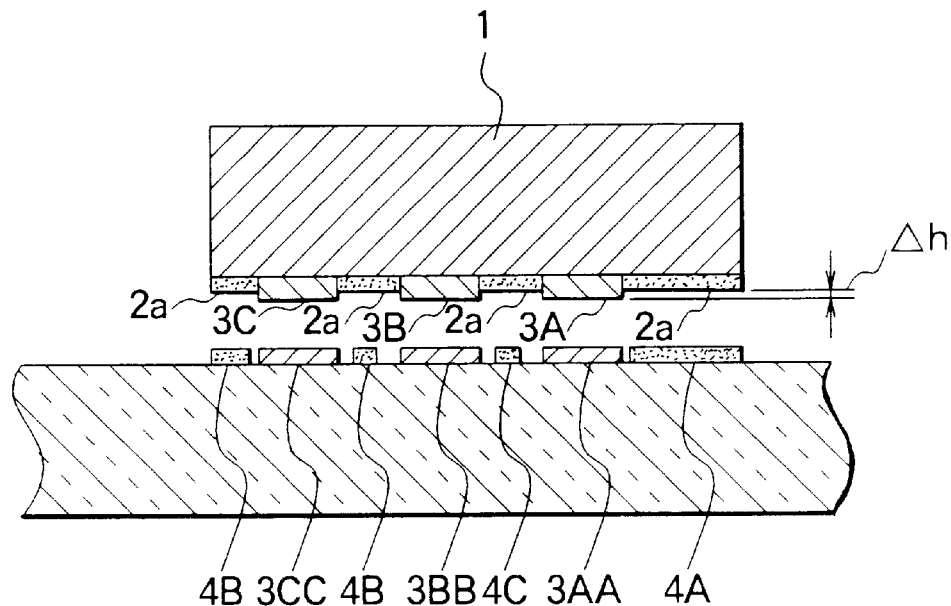
FIG. 33 is a cross-sectional view of a wiring substrate and semiconductor chip for describing an alignment between the wiring substrate and the semiconductor chip.
Figure 34:
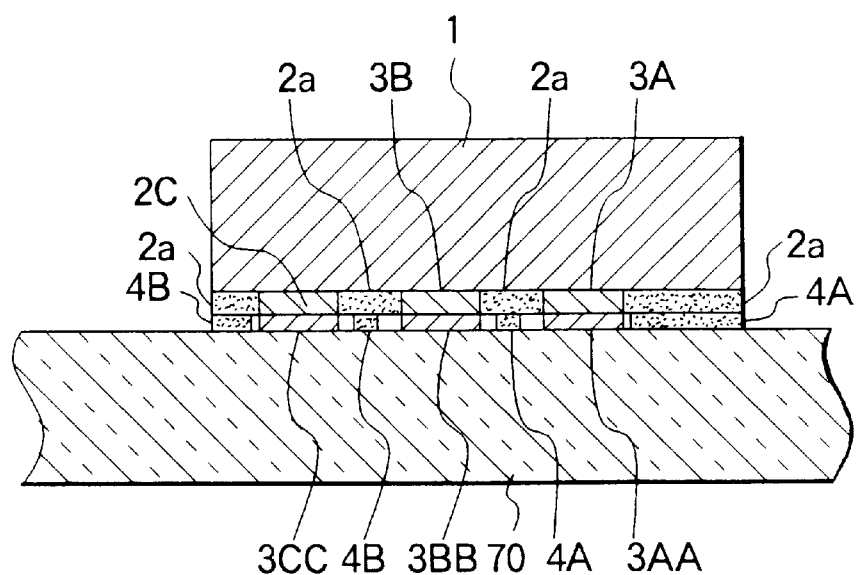
FIG. 34 is a cross-sectional view of a wiring substrate and semiconductor chip, showing a state in which the semiconductor chip is mounted on the wiring substrate in FIG. 32.

The electrodes 3A, 3B, 3C of the semiconductor chip 1 thus arranged are adjusted to the positions of conductive wiring 3AA, 3BB, 3CC of the wiring insulating substrate 70. At this time, as shown in FIG. 33 the electrodes 3A to 3C are positioned to be in opposed relation to the conductive wiring 3AA to 3CC, and the anode junctioning conductive pieces 4A, 4B are positioned to face the insulating coat 2a provided on the semiconductor chip 1 surface. After the positioning is completed, the semiconductor chip 1 is stacked on the wiring insulating substrate 70, and the cathode of a direct-current voltage source, not shown, is connected to the semiconductor chip 1 and the anode of the direct-current voltage source is coupled to the anode junctioning conductive pieces 4A, 4B. In this state, when the anode junctioning conductive piece 4A is heated, as illustrated in FIG. 34 the anode junction is made between the anode junctioning conductive pieces 4A, 4B and the insulating coat 2a on the semiconductor chip 1. As a result, the conductive wiring 3AA to 3CC are subjected to compression due to the electrode portions 3A to 3C with a magnitude corresponding to $\Delta h$, thus making the electrical connections therebetween. In addition, the semiconductor chip 1 and the wiring insulating substrate 70 are firmly joined with each other through the insulating coat 2a and the anode junctioning conductive pieces 4A, 4B.

Ninth Embodiment

Although in FIGS. 32 and 33 the anode junctioning conductive pieces 4A, 4B are formed in the wiring insulating substrate 70 side and the anode junction is made with the insulating coat 2a being provided on the semiconductor chip surface and used as the anode, in the case that, contrary to this, the wiring insulating substrate 70 side is used as the cathode and the semiconductor chip side is used as the anode, as illustrated in FIG. 29 each of the anode junctioning conductive pieces (metallic coat) is adhered onto an electrical insulating film surrounding an electrode 2 so as to maintain sufficient insulation from the electrode 2. Further, the insulating coat 2a is adhered onto the wiring insulating substrate 70 other than the wiring conductors 3AA to 3CC.

Thereafter, the electrodes 2 of the semiconductor chip 1 are positioned to the wiring conductors 3AA to 3CC of the wiring insulating substrate 70 and are layed thereon, before the anode of a direct-current voltage source, not shown, is connected to the semiconductor chip 1 and the cathode thereof is connected to the anode junctioning conductive pieces 4A, 4B so that the anode junction is made between the insulating coat 2a and the anode junctioning conductive pieces 4A, 4B to make electrical junctions between the electrodes 2 and the wiring conductors 3AA to 3CC.

Tenth Embodiment

Figure 35A:
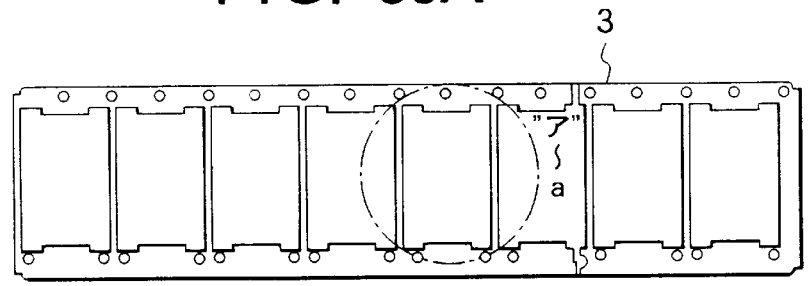
FIGS. 35A, 35B and 35C are plan views showing a plane configuration of a lead frame to be used in manufacturing a semiconductor device according to an anode junction method.
Figure 35B:
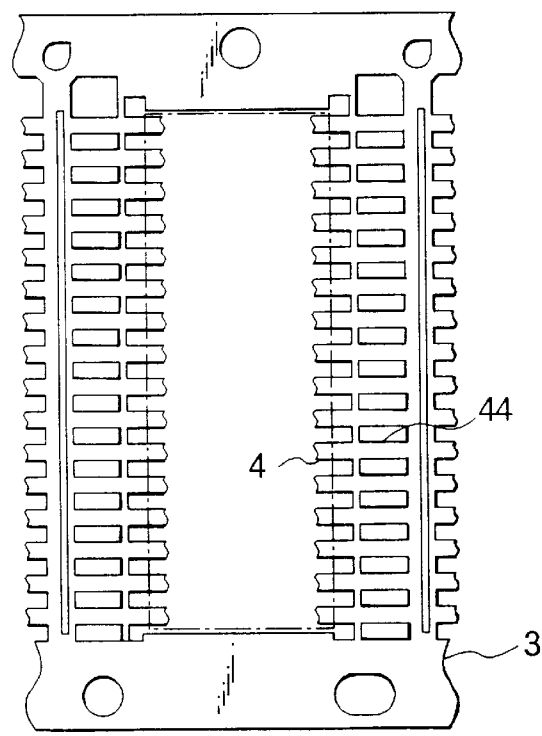
Figure 35C:
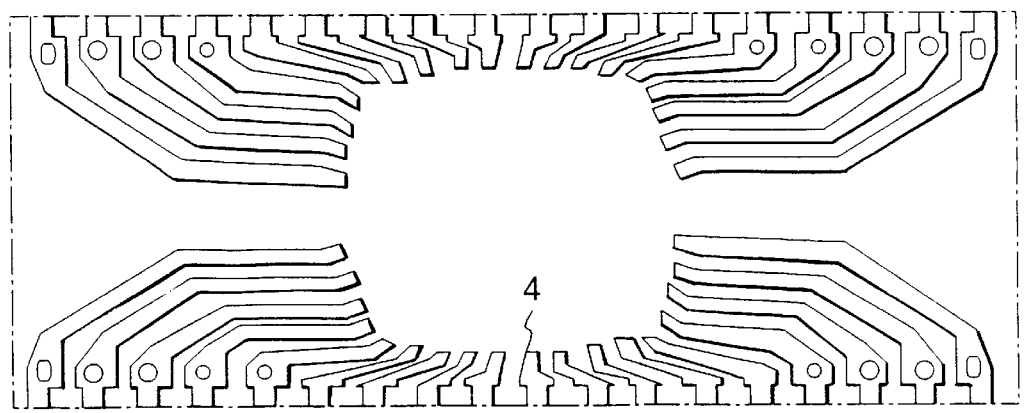

FIGS. 35A to 35C are plan views showing in detail a structure of a lead frame used in manufacturing a semiconductor device using the anode junction method according to this embodiment. FIG. 35A shows one example in which 8 lead groups are successively arranged. In the illustration, numeral 3 designates a lead frame border. FIG. 35B is an enlarged illustration of a portion indicated by "a" in FIG. 35A. In the illustration, numeral 3 represents a lead frame border, numeral 4a denotes inner leads whose tip portions to be joined with a semiconductor chip are omitted, and numeral 44 depicts outer leads. FIG. 35C shows the tip portions of the inner leads 4a which are omitted in FIG. 35B.

In FIG. 35C, although the tip portions of the inner leads designated at 4a are not shown to come approach to the central portion, this is to facilitate the comparison with the conventional inner leads shown in FIG. 42. Thus, it is possible for the tip portions of the inner leads 4a to be extended to approach the central portion. As shown in FIG. 35A, the die pad 41 and the suspended leads 42 for supporting the die pad 41 are unnecessary, with the result that the separation between the inner leads can be made larger. In addition, because there is no die pad 41, the central portion can freely be used for the inner leads. In addition, although the tip portions of the conventional inner leads 4a require expensive silver plating because of the ultrasonic thermo-compression bonding with gold lines, the anode junction method eliminates the requirement of precious-metal plating. Further, as long as the inner lead 4a surface has a high degree of flatness, even if a metallic oxide film exists on the inner lead 4a, the anode junction can be accomplished without any problem and the inner lead 4a can be firmly junctioned with the semiconductor chip 1.

Although in FIG. 35A spaces are present in place of the suspended leads, when a lead frame is used for the anode junction according to this embodiment, the tip portions of the inner leads 4a can be disposed at the positions corresponding to the electrodes 2 arranged at the four sides of the semiconductor chip. Further, although t the conventional lead frame does not at minimum allow the tip portions of the inner leads to be arranged at the portions of the suspended leads, this embodiment can remove this limitation.

Eleventh Embodiment

The lead frame shown in FIGS. 35A to 35C is usable as a jig for simultaneously placing a plurality of semiconductor chips, to be anode-junctioned, at the normal positions of the inner leads 4a. In this case, two leads frame 3 are stacked on the top of each other so that the pitch holes made in the lead frame borders are aligned with each other. The inner leads 4a of the upper side lead frames 3 are bent upwardly at right angles along the circumferential configuration of the semiconductor chip 1. In addition, the tip portions of the inner leads 4a of the lower side lead frame 3 are made to extend up to the positions corresponding to the electrodes 2 on the semiconductor chip 1 as indicated in black in FIG. 3.

In this state, the wiring surface of the semiconductor chip 1 is set to face downward and is put down on the inner leads 4a of the lead frame 3 along the bent inner leads 4a. As a result, the electrodes 2 and the inner leads 4a to be anode-junctioned are accurately positioned without misalignment. Using this jig allows the simultaneous anode junctioning of a number of chips, thus improving the efficiency of semiconductor device manufacturing work.

Twelfth Embodiment

Figure 36A:
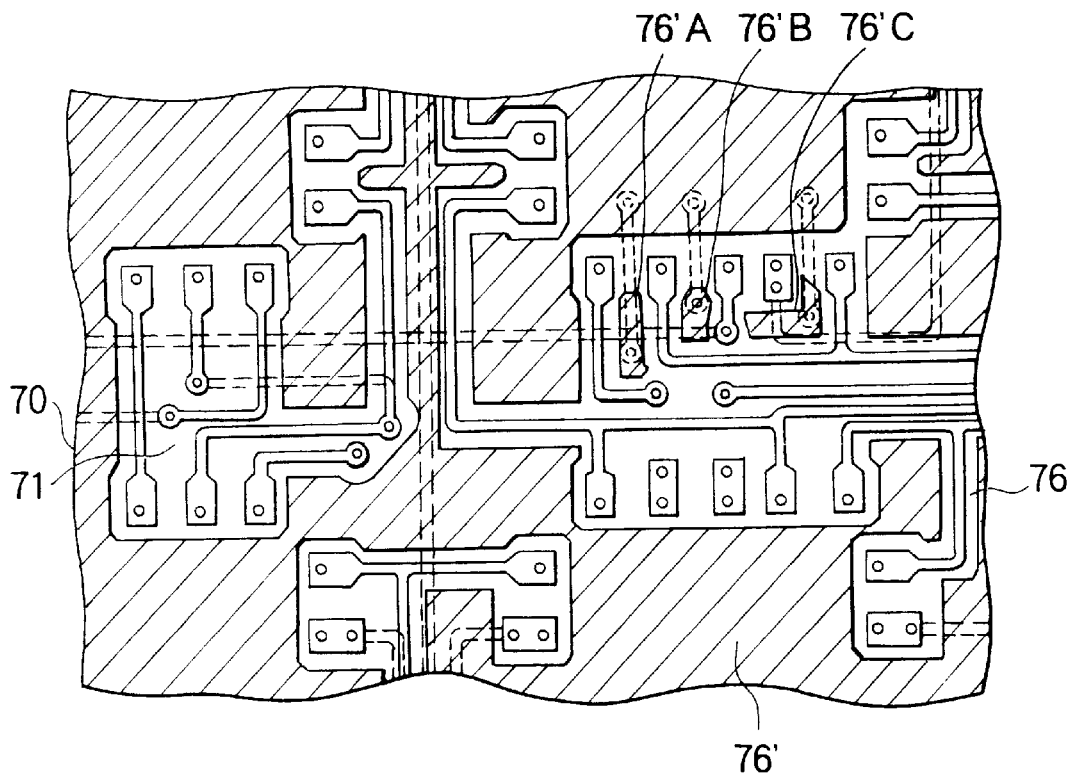
FIGS. 36A and 36B are a plan view of a wiring substrate to be used in manufacturing a laminated multi-layer wiring substrate according to an anode junction method and a cross-sectional view of a completed laminated multi-layer wiring substrate, respectively.
Figure 36B:
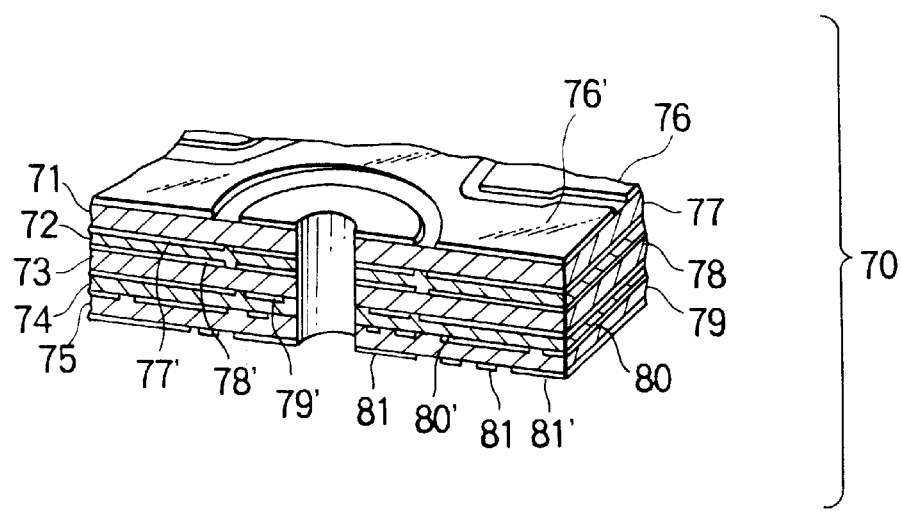

FIGS. 36A, 36B are illustrations of one example in which the anode junction method is applicable to the fabrication of a laminated multi-layer substrate. A multi-layer insulating substrate 70 is constructed with five insulating substrates 71, 72, 73, 74 and 75, and wiring 76, 77, 78, 79, 80 and 81 are provided on the insulating substrates 71, 72, 73, 74 and 75, respectively. FIG. 36A shows the wiring 76 for the insulating substrate 71. Further, for the construction of a laminated multi-layer substrate by the anode junction method according to this embodiment, anode junctioning pieces 76', 77', 78', 79', 80' and 81' are placed on the insulating substrates 71, 72, 73, 74 and 75, respectively. FIG. 36A illustrates the anode junctioning piece 76' for the insulating substrate 71.

In a case where, for example, the anode junctioning piece 76' is formed on the insulating substrate 71, a copper foil plate is affixed onto the entire surface of the insulating substrate 71, before the conductive wiring 76 is patterned by etching. In order to leave the pattern, the etching is carried out around the pattern to keep a width corresponding to the minimum insulating distance. In this case, the copper foil plate in which the separation between the conductive wiring is narrow is etched, while, when the separation therebetween is wide, the copper foil plate remains therebetween, that is, as shown in FIG. 36A the copper foil plate being the anode junctioning piece 76' may remain over a wide range, or depending on places, the copper foil plate can remain as small isolated islands as indicated by 76'A, 76'B, 76'C. An insulating coat is adhered onto the remaining copper foil plate, thereby making the anode junctioning pieces. At this time, the remaining copper foil portions 76'A, 76'B, 76'C are electrically coupled to each other through-holes to have the same polarity.

FIG. 36B is an enlarged view of a through-hole section. In the illustration, the conductive wiring 76, 77, 78, 79, 80 and 81 are painted out in black and the anode junctioning pieces 76', 77', 78', 79', 80' and 81' are indicated in white. The through-hole illustrated is for electrical coupling of the conductors 81, 78 and 77.

Next, a description will be made in terms of the process by which the insulating substrates 71 to 75 are stacked up on top of each other to make the multi-layer insulating substrate 70. First:

1) The conductive wiring 78 and the anode junctioning pieces 78' are formed on the insulating substrate 73, and the conductive wiring 79 and the anode junctioning piece 79' are made by burning and etching;
2) The conductive wiring 77 and the anode junctioning piece 77' are formed on the insulating substrate 72 by burning and etching, and further the conductive wiring 80 and the anode junctioning piece 80' are made on the insulating substrate 74 by burning and etching;
3) The conductive wiring 76 and the anode junctioning piece 76' are made on the insulating substrate 71 by burning and etching; and
4) The conductive wiring 81 and the anode junctioning piece 81' are made on the insulating substrate 75 by burning and etching.

In piling up the insulating substrates 71 to 75, the insulating substrate 73 is used as the anode, the insulating substrate 72 is placed on the upper side of the insulating substrate 73, the insulating substrate 74 is placed on the lower side of the insulating substrate 73, and the insulating substrates 72, 74 are used as the cathode, before a direct-current voltage is applied while heating so that the anode junctioning piece 78' of the insulating substrate 73 is joined with the insulating substrate 72 and at the same time the anode junctioning piece 79' of the insulating substrate 72 and the insulating substrate 74 are anode-junctioned.

After the insulating substrates 72, 73 and 74 are anode-junctioned to make a three-layer substrate, the three-layer substrate is used as the anode, the insulating substrate 71 is placed on the upper side of the three-layer substrate and the insulating substrate 75 is placed on the lower side thereof, and the insulating substrates 71, 75 are used as the cathode so that, while heating, a direct-current voltage is applied to carry out the anode junction. At this time, the anode functioning piece 77' of the insulating substrate 72 and the insulating substrate 71 are anode-junctioned, and the anode junctioning piece 80' of the insulating substrate 74 and the insulating substrate 71 are anode-junctioned, thus completing a six-layer substrate.

In the case of the laminated substrate thus formed, the anode junctioning piece can be utilized as grounding surface, with the result that there is no need for a special grounding layer being added, thus reducing the number of wiring layers. In addition, the anode junctioning piece can also be used as an electromagnetic shield.

Thirteenth Embodiment

Figure 37A:
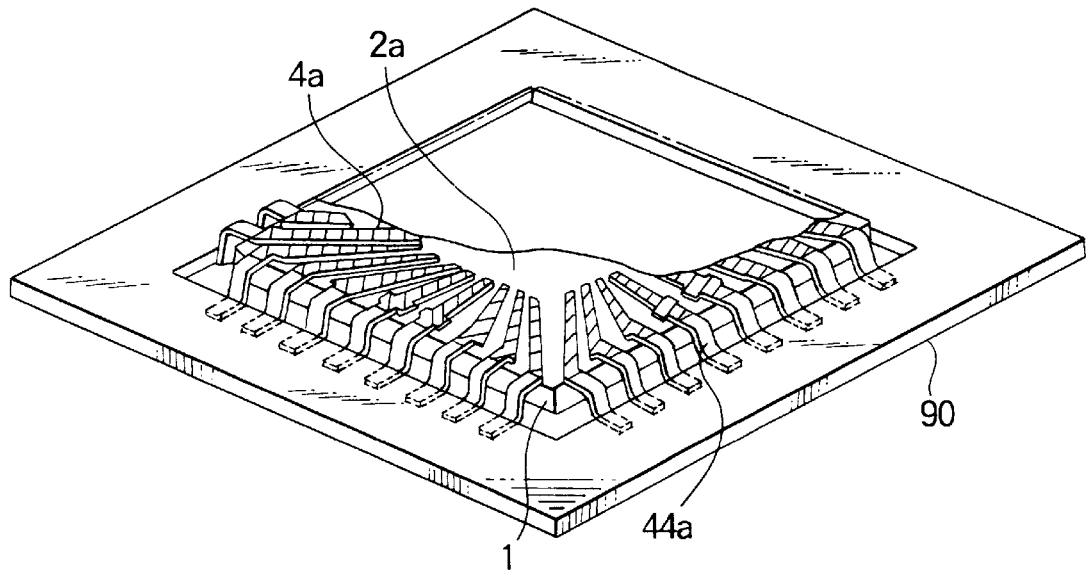
FIGS. 37A and 37B are perspective views of semiconductor chips for describing a state in which an external connection lead is joined with a wiring conductor according to an anode junction method.

FIG. 37A is a perspective view of a semiconductor device, showing a state in which external leads 44 are anode-junctioned with a wiring substrate and a mother board substrate. In the illustration, numeral 90 represents a metallic plate having a given weight. Inside the metallic plate 90 there is provided an opening section made to the contour of a semiconductor device using a QFP package whose contour is square. When the top surface of the semiconductor device is put into this opening section, the sides of the opening section are placed on junctioning portions 44a being the bent tip portions of the external leads 44 so that a given load is applied thereto. After the bent tip portions of the external leads are placed on the wiring conductors on the wiring substrate, the metallic plate 90 is placed on the junctioning portions 44a, whereby the metallic plate 90 becomes the common electrode for the external leads 44, and because of the load applied, the degree of flatness of the junctioning portions 44a is adjustable.

Figure 37B:
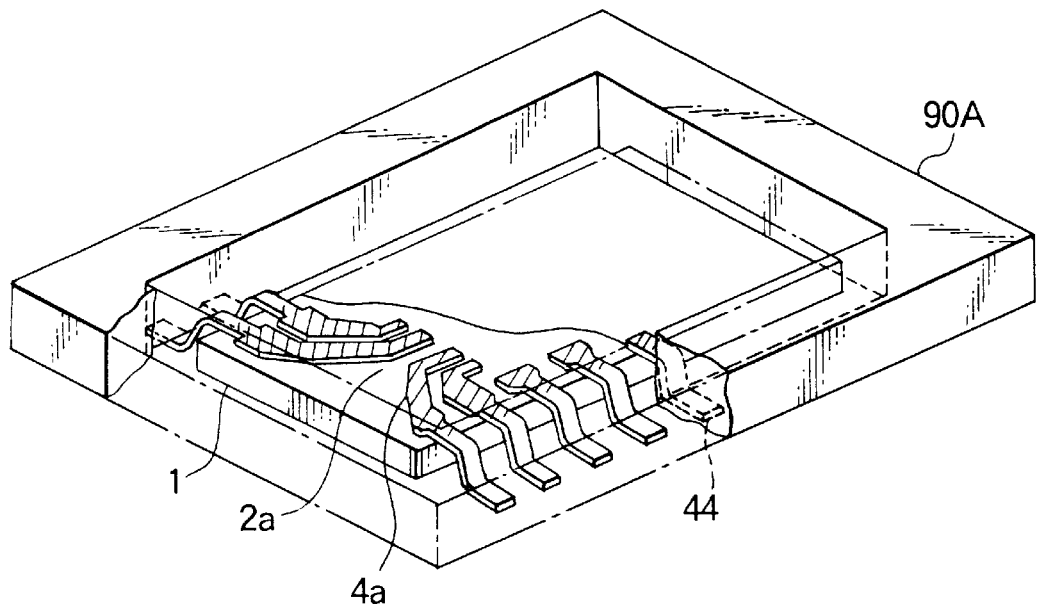

FIG. 37B is a perspective view of a semiconductor device, showing a state in which, for mounting, external leads 44 of the semiconductor device using an SOP package whose contour is rectangular are anode-junctioned with a wiring substrate or mother board substrate. In the illustration, numeral 90A represents a metallic plate having a given weight. Inside the metallic plate 90A there is provided an opening section made to the contour of the semiconductor. When the top surface of the semiconductor device is put into the opening section, the sides of the opening section are placed on junctioning portions 44a of external leads 44 so that a given load is applied thereto. The use of the metallic plate 90A is the same as that of the metallic plate 90. In addition, it is also appropriate that the metallic plate 90A is made to have a U-shape or the like. The bottom line is that the metallic pieces are placed so that a given load is applied to the junctioning portions 44a.

Next, a detailed description will be made in terms of wiring conductors for the junctioning portions 44a. In this embodiment, in the contact surface of the junctioning portion 44a, an area A is defined which handles the mechanical strength for the wiring conductor and an area B is also defined which handles the electrical connection for the wiring conductor. Onto the area A there is adhered an insulating coat 4a which has a slightly conductive property when being subjected to heating. On the other hand, nothing is adhered onto the area B, thus keeping the electrical connection with the wiring conductor.

In such a state, the junctioning portions 44a are placed on the corresponding wiring conductors, before the sides of the opening section of the metallic plate 90 are placed on the junctioning portions 44a so that a load is applied thereto, and the negative potential of a direct-current power supply voltage is applied to the junctioning portions 44a through the metallic plate 90. At this time, all the wiring conductors are short-circuited at the time of the formation of the wiring pattern so as to be subjected to the positive potential of the direct-current power supply voltage. After the anode junction, they are released from the short-circuited state.

After the respective potentials are prepared for the application, while the junctioning portions 44a are heated, the direct-current power supply voltage causes a positive current to flow from the wiring conductors to the metallic plate 90 so that the anode junction is made between the junctioning surface of the junctioning portions 44 and the wiring conductors. As a result, electrostatic adhesive strength and electrochemical bonding strength are generated between the area A and the wiring conductor to accomplish the anode junction therebetween, and the area B and the wiring conductor are electrically junctioned with each other due to the anode junction. When being electrically joined, the junctioning surface of the area B is constructed so as to the plastically deform, and the junctioning portions 44a are pressure-joined with the wiring conductor by the force generated when deformed.

In the case that the semiconductor chip 1 and the inner leads 4a are anode-junctioned with each other, the area of the entire surface of the semiconductor chip 1 in which the electrodes 2 are disposed is defined as the area B, and the surface other than the electrode 2 disposed area is defined as the area A.

Fourteenth Embodiment

In the forgoing embodiment, as described with reference to FIGS. 37A and 37B, a jig is provided which is made such that the external lead 44 is used as the cathode and the wiring conductor is used as the anode for the anode junction between the external lead 44 and the wiring conductor. However, it is also possible that by using such a jig an anode junction is made between the external lead 44 of the semiconductor chip 1 and the wiring conductor with the external lead 44 being used as the anode and the wiring conductor being used as the cathode. In this case, an insulating coat 2a is adhered onto substantially half of 10 upper and lower external lead connecting portions patterned, for example, on the laminated insulating substrate 70 shown in FIG. 36, which in turn, are connected to an electrically insulating film 76' indicated by hatching. At this time, the insulating coat 4a is adhered onto the electrically insulating film 76'.

Furthermore, as shown in FIG. 37A, the junctioning portions 44a of the semiconductor chip 1 are placed on the external lead connecting portions, and the junctioning portions 44a are pressed by the metallic plate 90. At this time, while a positive potential is applied to the metallic plate 90 and a negative potential is applied to the insulating coat 4a of the wiring insulating substrate 70, the wiring insulating substrate 70 is heated, whereby the junctioning surface of the external lead 44 and the external lead connecting portion are anode-junctioned with each other. When a projection is formed at a portion of the external lead connecting portion onto which the insulating coat is not adhered, the electrical connection is improved between the junctioning surface of the external lead 44 and the external lead connection portion in the anode junction.

Fifteenth Embodiment

Although in FIGS. 37A and 37B the external leads 44 extend to cross over the periphery of the semiconductor chip 1 and the junctioning portions 44a which are the tip portions thereof are anode-junctioned with the wiring conductors, it is also appropriate that portion of the inner lead 4a other than the portion to be anode-junctioned (hatched portion) be cut off and the surface of the inner lead 4a remaining on the semiconductor chip 1 be anode-junctioned with the corresponding wiring conductor. As a result, the mounting area of the circuit can be enlarged by the extension of the external lead 44.

Sixteenth Embodiment

As another application example, there is a method in which, in the semiconductor based on the current wire bonding method, a chip is anode-junctioned with a die pad portion of a lead frame. This method is classified into a method in which an insulating coat is adhered onto the rear surface of the semiconductor chip and the anode junction is made with the semiconductor chip side being used as the cathode and the die pad section being used as the anode, and a method in which an insulating coat 2a is adhered onto a surface of a frame die pad section and the anode junction is carried out with the lead frame die pad section being used as the cathode and the semiconductor chip side being used as the anode.

Seventeenth Embodiment

Figure 38A:
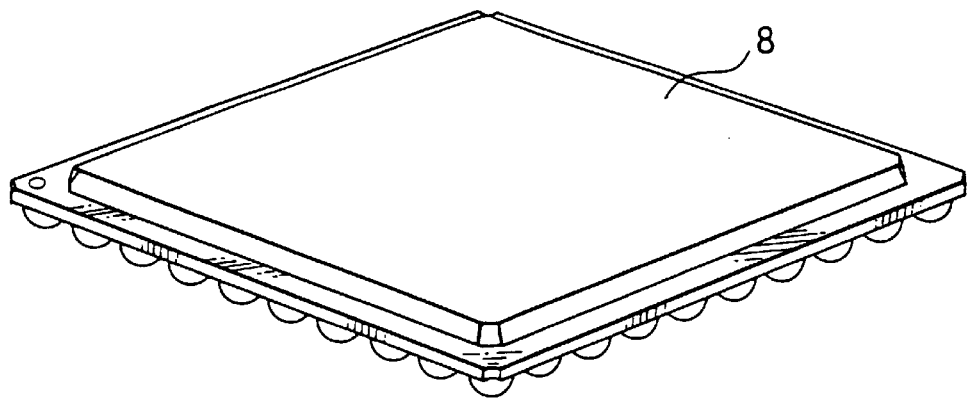
FIGS. 38A to 38C are perspective views and cross-sectional view schematically showing a semiconductor device using a ball grid array in place of an external connection lead.
Figure 38B:
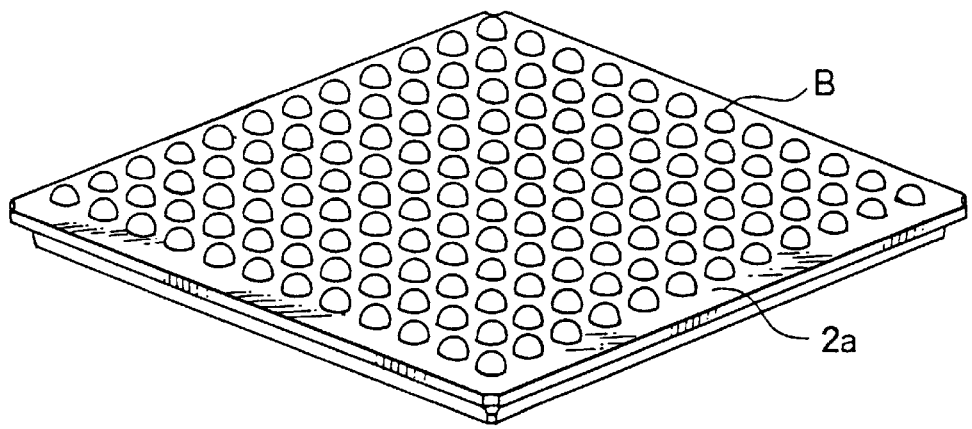

If the anode junction is used in mounting a semiconductor device with a ball grid array on a wiring substrate, there results in the effect that the mounting work can be made simple. FIG. 38A is a perspective view showing a semiconductor device using a ball grid array in place of an external connecting lead. FIG. 38B is a perspective view showing the bottom surface of the semiconductor device. Ball-like bumps B are disposed on the bottom surface to take a matrix configuration. These bumps B are connected to electrodes on the semiconductor chip 1.

Figure 38C:
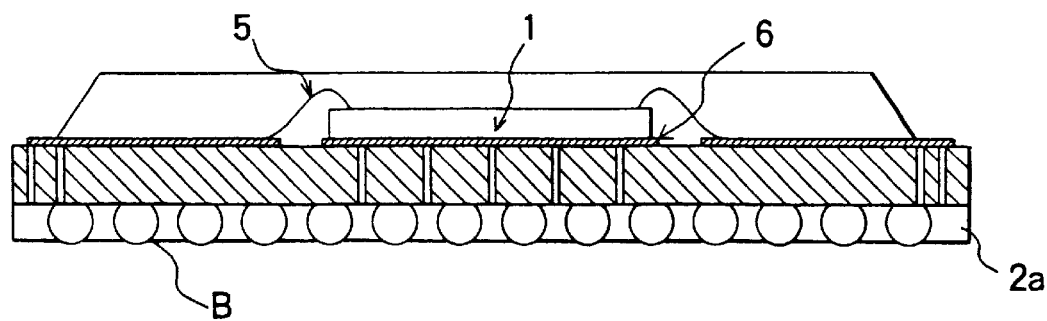
Figure 39:
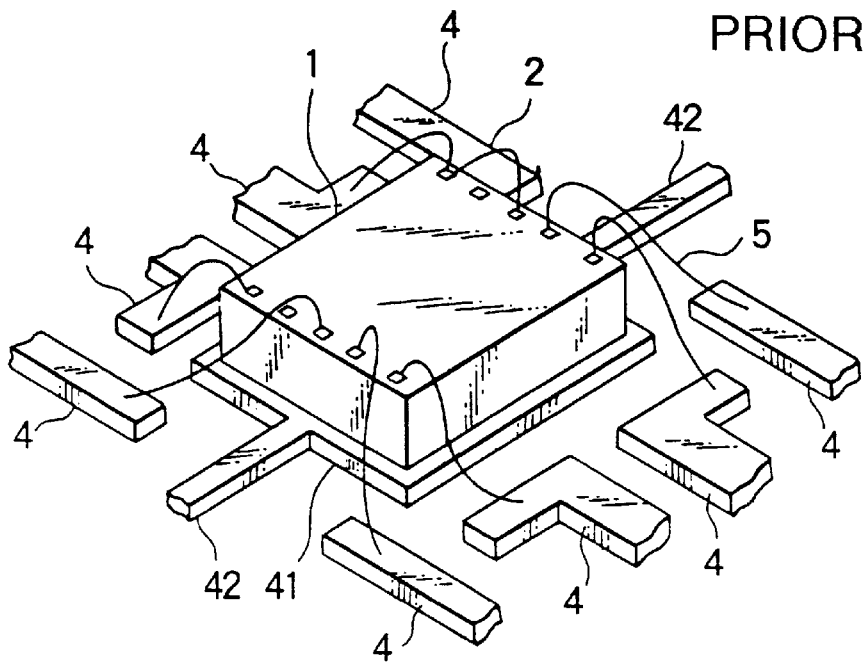
FIG. 39 is a perspective view of a semiconductor chip for describing a conventional wire bonding method.
Figure 40:
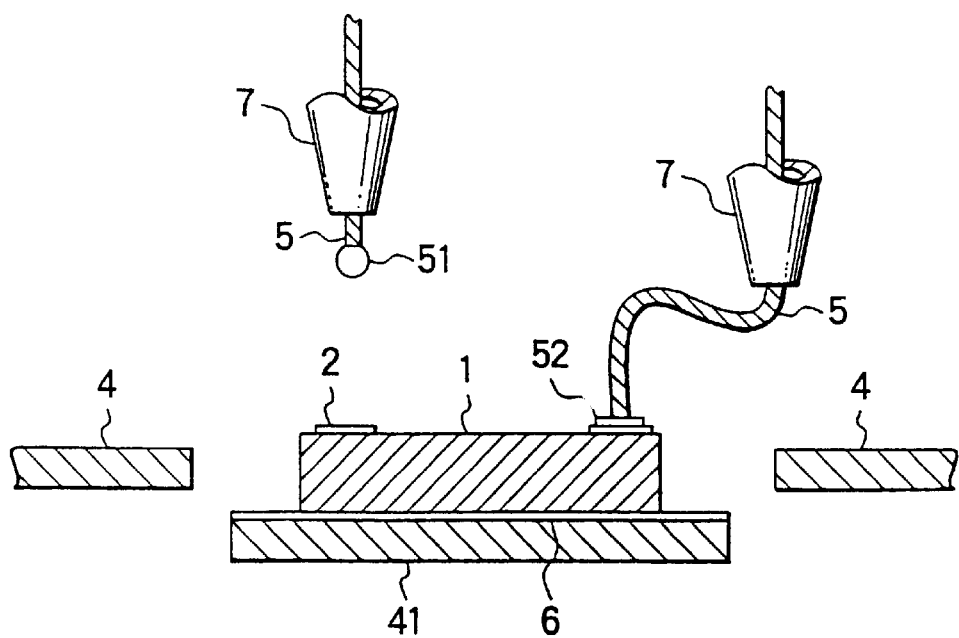
FIG. 40 is a cross-sectional view of a semiconductor chip for describing a wire bonding using a gold line.
Figure 41A:
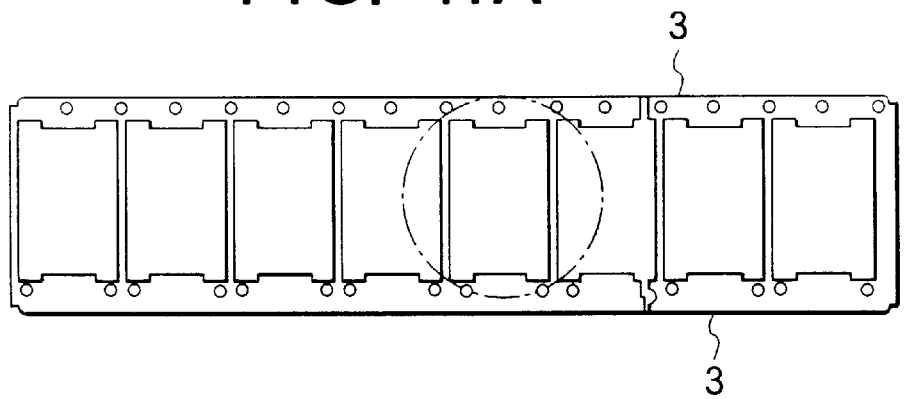
FIGS. 41A and 41B are a plan view showing a conventional lead frame and an enlarged plan view showing a portion thereof.
Figure 41B:
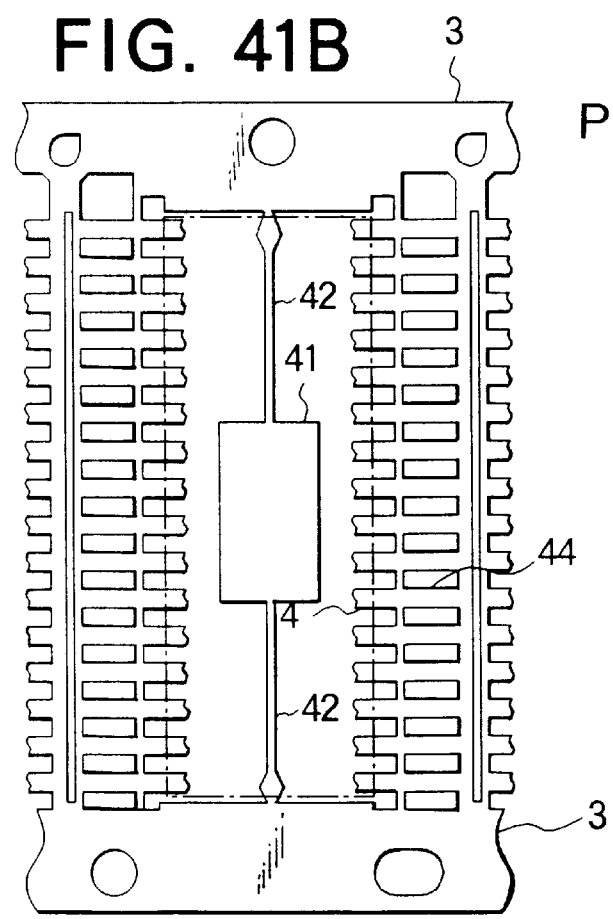

FIG. 38C is a cross-sectional view of the semiconductor device shown in FIG. 38A. The bumps B are coupled to the electrodes on the semiconductor chip 1 through gold lines 5. In addition, an insulating coat 2a which has a slight conductive property when being heated is adhered onto the bottom surface of the semiconductor device, and further the surfaces of the bumps B protrude several microns from the film surface of the insulating coat 2a. Accordingly, when the anode junction is made between the wiring conductors and the insulating coat 2a after the bumps B are positioned on the wiring conductors on the wiring substrate, the bumps B and the corresponding wiring conductors are electrically connected to each other. As a result, it is possible to surely mount a semiconductor device, even having a large-scale ball grid array, on a wiring substrate in a short period of time.

It should be understood that the foregoing relates to only preferred embodiments of the invention, and that it is intended to cover all changes and modifications of the embodiments of the invention herein used for the purpose of the disclosure, which do not constitute departures from the spirit and scope of the invention.

What is claimed is:

1. An electronic component including:
   a semiconductor chip having a surface and electrodes disposed on the surface;
   an electrically insulating coating that is electrically conductive only when heated, disposed on a portion of the surface of said semiconductor chip;
   a lead frame including inner leads extending from said lead frame and anodically bonded to said insulating coating with said inner leads electrically connected to said electrodes; and
   a metallic coating and an insulating passivating film disposed on the surface of said semiconductor chip.

2. An electronic component including:
   a semiconductor chip having a surface and electrodes disposed on the surface;
   an electrically insulating coating that is electrically conductive only when heated, disposed on a portion of the surface of said semiconductor chip, and wherein said electrodes on said semiconductor chip project farther from the surface than said insulating coating;
   a conductive material disposed on said electrodes, said conductive material protruding beyond said insulating coating; and
   a lead frame including inner leads extending from said lead frame and anodically bonded to said insulating coating with said inner leads electrically connected to said electrodes through said conductive material.

3. An electronic component including:
   a semiconductor chip having a surface and electrodes disposed on the surface;
   an electrically insulating coating that is electrically conductive only when heated, disposed on a portion of the surface of said semiconductor chip and wherein said electrodes on said semiconductor chip project farther from the surface than said insulating coating and are convex; and
   a lead frame including inner leads extending from said lead frame and anodically bonded to said insulating coating with said inner leads electrically connected to said electrodes.

4. An electronic component including:
   a semiconductor chip having a surface and electrodes disposed on the surface;
   an electrically insulating coating that is electrically conductive only when heated, disposed on a portion of the surface of said semiconductor chip and wherein said electrodes are recessed with respect to said insulating coating; and
   a lead frame including inner leads extending from said lead frame and anodically bonded to said insulating coating with said inner leads electrically connected to said electrodes.

5. The electronic component of claim 2 wherein said conductive material is selected from the group consisting of mercury and an electrically conducting resin.

6. The electronic component of claim 2 wherein said conductive material is selected from the group consisting of aluminum, solder, and gold.

* * * * *